United States Patent
Song et al.

(10) Patent No.: US 11,276,821 B2
(45) Date of Patent: Mar. 15, 2022

(54) VARIABLE RESISTANCE MEMORY DEVICE

(71) Applicant: SAMSUNG ELECTRONICS CO., LTD., Suwon-si (KR)

(72) Inventors: Seulji Song, Yongin-si (KR); Jonguk Kim, Yongin-si (KR); Kyusul Park, Suwon-si (KR); Woohyun Park, Seoul (KR); Jonghyun Paek, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 16/741,936

(22) Filed: Jan. 14, 2020

(65) Prior Publication Data

US 2021/0104671 A1 Apr. 8, 2021

(30) Foreign Application Priority Data

Oct. 7, 2019 (KR) .................. 10-2019-0124153

(51) Int. Cl.
*H01L 45/00* (2006.01)
*H01L 27/24* (2006.01)

(52) U.S. Cl.
CPC ...... *H01L 45/1691* (2013.01); *H01L 27/2481* (2013.01); *H01L 45/06* (2013.01); *H01L 45/1253* (2013.01); *H01L 45/1675* (2013.01)

(58) Field of Classification Search
CPC ............ H01L 45/1233; H01L 27/2463; H01L 27/2409; H01L 27/2418; H01L 27/2427
See application file for complete search history.

(56) References Cited

U.S. PATENT DOCUMENTS

| | | | |
|---|---|---|---|
| 7,977,662 B2 | 7/2011 | Ryoo et al. | |
| 8,890,107 B2 | 11/2014 | Matsui et al. | |
| 9,136,307 B2 | 9/2015 | Pellizzer | |
| 9,385,318 B1 | 7/2016 | Henri | |
| 9,806,129 B2 | 10/2017 | Ravasio et al. | |
| 10,147,875 B1 | 12/2018 | Hansen et al. | |
| 10,249,819 B2 | 4/2019 | Campbell et al. | |
| 10,879,461 B2* | 12/2020 | Kim ................ | H01L 27/224 |
| 2009/0206317 A1 | 8/2009 | Kang | |
| 2009/0289297 A1 | 11/2009 | Kim et al. | |
| 2018/0366645 A1 | 12/2018 | Campbell et al. | |

FOREIGN PATENT DOCUMENTS

KR 10-2009-0090003 A 8/2009
KR 10-1069282 B1 10/2011

* cited by examiner

*Primary Examiner* — Mark V Prenty
(74) *Attorney, Agent, or Firm* — Sughrue Mion, PLLC

(57) ABSTRACT

A semiconductor device includes a plurality of first conductive lines disposed on a substrate, a plurality of second conductive lines intersecting the plurality of first conductive lines, and a plurality of cell structures interposed between the plurality of first conductive lines and the plurality of second conductive lines. At least one among the plurality of cell structures includes a first electrode, a switching element disposed on the first electrode, a second electrode disposed on the switching element, a first metal pattern disposed on the second electrode, a variable resistance pattern interposed between the first metal pattern and at least one among the plurality of second conductive lines, and a first spacer disposed on a sidewall of the variable resistance pattern, a sidewall of the first metal pattern and a sidewall of the second electrode.

16 Claims, 26 Drawing Sheets

VARIABLE RESISTANCE MEMORY DEVICE

CROSS-REFERENCE TO THE RELATED APPLICATION

This application is based on and claims priority under 35 U.S.C. § 119 to Korean Patent Application No. 10-2019-0124153, filed on Oct. 7, 2019, in the Korean Intellectual Property Office, the disclosure of which is incorporated by reference herein in its entirety.

BACKGROUND

The disclosure relates to semiconductor devices, and more particularly, to a variable resistance memory device.

Semiconductor devices can be classified into memory devices and logic devices. Memory devices store data. In general, semiconductor memory devices can be broadly classified into volatile memory devices and nonvolatile memory devices. The volatile memory devices, such as Dynamic Random Access Memory (DRAM) and Static Random Access Memory (SRAM), lose stored data when their power supply is interrupted. The nonvolatile memory devices, such as programmable ROM (PROM), erasable PROM (EPROM), electrically erasable PROM (EEPROM), and Flash memory devices, do not lose stored data even when their power supply is inhibited.

SUMMARY

According to embodiments, a semiconductor device includes a plurality of first conductive lines disposed on a substrate, a plurality of second conductive lines intersecting the plurality of first conductive lines, and a plurality of cell structures interposed between the plurality of first conductive lines and the plurality of second conductive lines. At least one among the plurality of cell structures includes a first electrode, a switching element disposed on the first electrode, a second electrode disposed on the switching element, a first metal pattern disposed on the second electrode, a variable resistance pattern interposed between the first metal pattern and at least one among the plurality of second conductive lines, and a first spacer disposed on a sidewall of the variable resistance pattern, a sidewall of the first metal pattern and a sidewall of the second electrode, a bottom surface of the first spacer being interposed between a top surface of the second electrode and a bottom surface of the second electrode. The at least one among the plurality of cell structures further includes a second spacer disposed on the first spacer and a sidewall of the switching element.

According to embodiments, a semiconductor device includes a plurality of first conductive lines disposed on a substrate, a plurality of second conductive lines intersecting the plurality of first conductive lines, a plurality of first cell structures interposed between the plurality of first conductive lines and the plurality of second conductive lines, and disposed adjacent to a center of a cell array area of the substrate, and a plurality of second cell structures interposed between the plurality of first conductive lines and the plurality of second conductive lines, and disposed on an edge of the cell array area. Each of the plurality of first cell structures includes a first electrode, a switching element disposed on the first electrode, a second electrode disposed on the switching element, a first metal pattern disposed on the second electrode, a variable resistance pattern interposed between the first metal pattern and at least one among the plurality of second conductive lines, a first spacer disposed on a sidewall of the variable resistance pattern and a top surface of the first metal pattern, and a second spacer disposed on the first spacer and a sidewall of the first metal pattern.

According to embodiments, a method of manufacturing a semiconductor device, includes forming a first conductive layer on a substrate, a second conductive layer on the first conductive layer, a switching layer on the second conductive layer, a third conductive layer on the switching layer, a first metal layer on the third conductive layer, and a variable resistance layer on the first metal layer, and forming a variable resistance pattern on the first metal layer, by etching the variable resistance layer. The method further includes forming a first spacer layer on a sidewall of the variable resistance pattern, a sidewall of the first metal layer at an edge of a cell array area of the substrate, and a sidewall of the second conductive layer at the edge of the cell array area, and forming a first metal pattern on the third conductive layer while forming a first spacer on the sidewall of the variable resistance pattern, a sidewall of the first metal pattern at the edge of the cell array area, and the sidewall of the second conductive layer at the edge of the cell array area, by etching the first spacer layer and the first metal layer, a bottom surface of the first spacer being interposed between a top surface of the second conductive layer and a bottom surface of the second conductive layer at the edge of the cell array area.

DETAILED DESCRIPTION OF EMBODIMENTS

Embodiments provide a variable resistance memory device having improved electrical characteristics due to prevention of bridging or current leakage caused by conductive polymers. The variable resistance memory device further prevents degradation of switching elements and variable resistance patterns.

Figure 1:
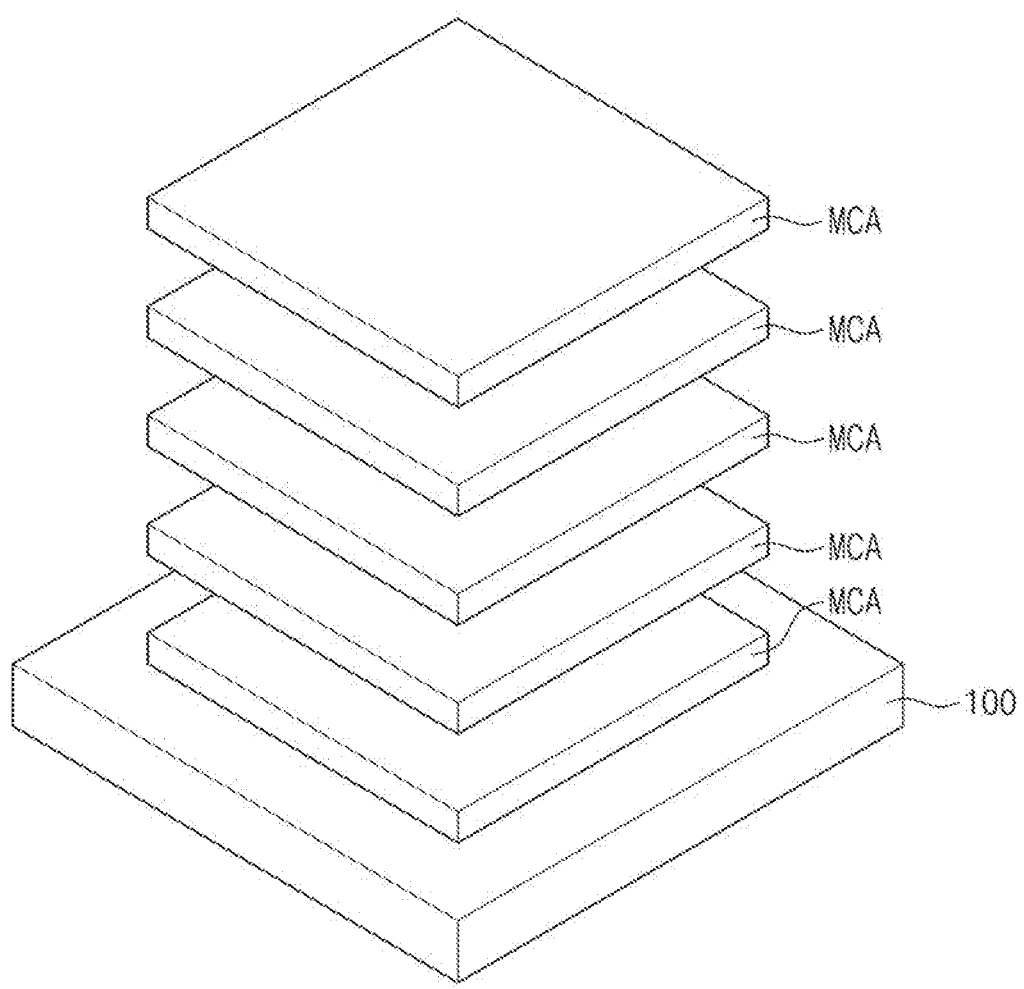
FIG. 1 is a conceptual view of variable resistance memory device according to embodiments.

FIG. 1 is a conceptual view of a variable resistance memory device according to embodiments. Referring to FIG. 1, the variable resistance memory device may include a plurality of memory cell stacks MCA sequentially stacked on a substrate 100. Each of the memory cell stacks MCA may include a plurality of variable resistance memory cells two-dimensionally arranged. The variable resistance memory device may include a plurality of conductive lines that are disposed to lie between the memory cell stacks MCA and to write, read, and erase the memory cells. FIG. 1 shows five memory cell stacks MCA, but the embodiments are not limited thereto.

Figure 2:
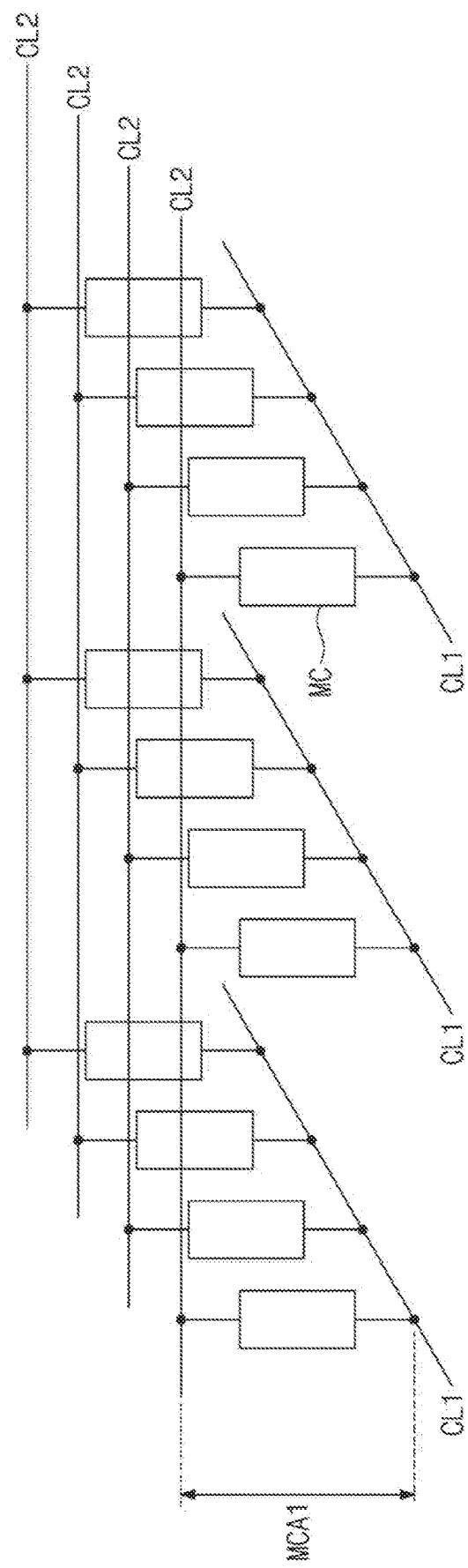
FIG. 2 is a circuit diagram of memory cell stacks of FIG. 1.

FIG. 2 is a circuit diagram of the memory cell stacks of FIG. 1. FIG. 2 shows a single memory cell stack MCA1. A first memory cell stack MCA1 may include memory cells MC at intersections between first conductive lines CL1 and second conductive lines CL2. A second memory cell stack may be provided on the first memory cell stack MCA1. Similar to the first memory cell stack MCA1, the second memory cell stack may include memory cells at intersections between third conductive lines and fourth conductive lines. For example, the third conductive lines may be vertically spaced apart from the second conductive lines CL2. Alternatively, the second conductive lines CL2 may be shared by the second memory stack and the first memory cell stack MCA1, and in this case, the third conductive lines may correspond to the second conductive lines CL2.

The memory cells MC included in the first memory cell stack MCA1 may be two-dimensionally arranged to constitute rows and columns on a substrate. Each of the memory cells MC may include a switching element and a variable resistance pattern. When the first conductive lines CL1 are provided between the substrate and the second conductive lines CL2, the switching element in each memory cell MC may be provided between the substrate and the variable resistance pattern. Alternatively, the variable resistance pattern may be provided between the substrate and the switching element.

The switching element may be disposed at a corresponding one of the intersections between the first conductive lines CL1 and the second conductive lines CL2, and may be physically separated from other switching elements disposed at adjacent intersections. The variable resistance pattern may be disposed at a corresponding one of the intersections between the first conductive lines CL1 and the second conductive lines CL2, and may be physically separated from other variable resistance patterns disposed at adjacent intersections. Alternatively, a physically connected one variable resistance pattern may be shared between a plurality of memory cells MC. For example, when viewed in plan, the variable resistance pattern may have a linear shape that extends along an extending direction either of the first conductive lines CL1 or of the second conductive lines CL2.

The second conductive lines CL2 may be shared by the first memory cell stack MCA1 and its overlying memory cell stack. Alternatively, each memory cell stack MCA may not share conductive lines, and may include the first conductive lines CL1 and the second conductive lines CL2.

Figure 3:
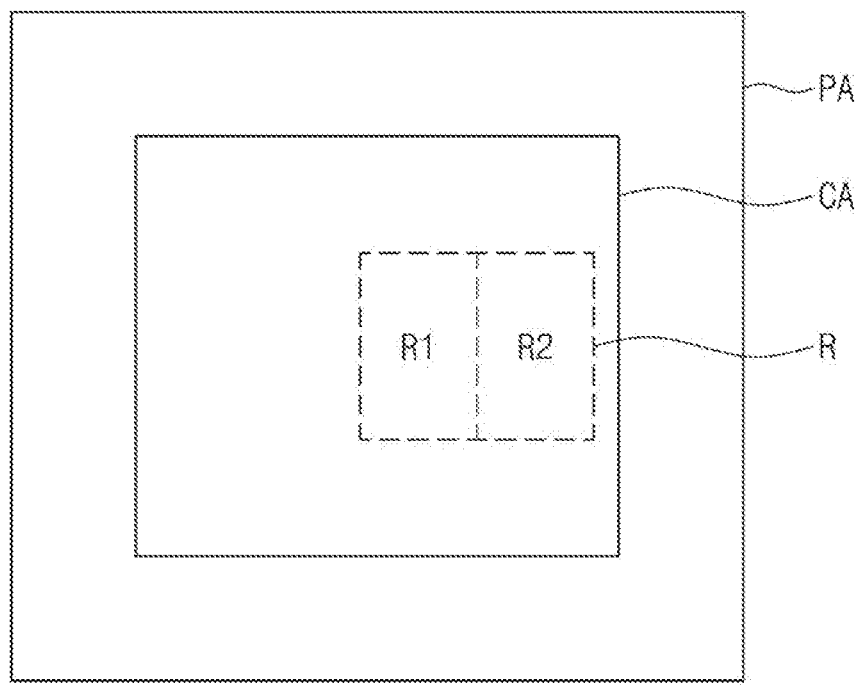
FIG. 3 is a plan view of a variable resistance memory device according to embodiments.
Figure 4:
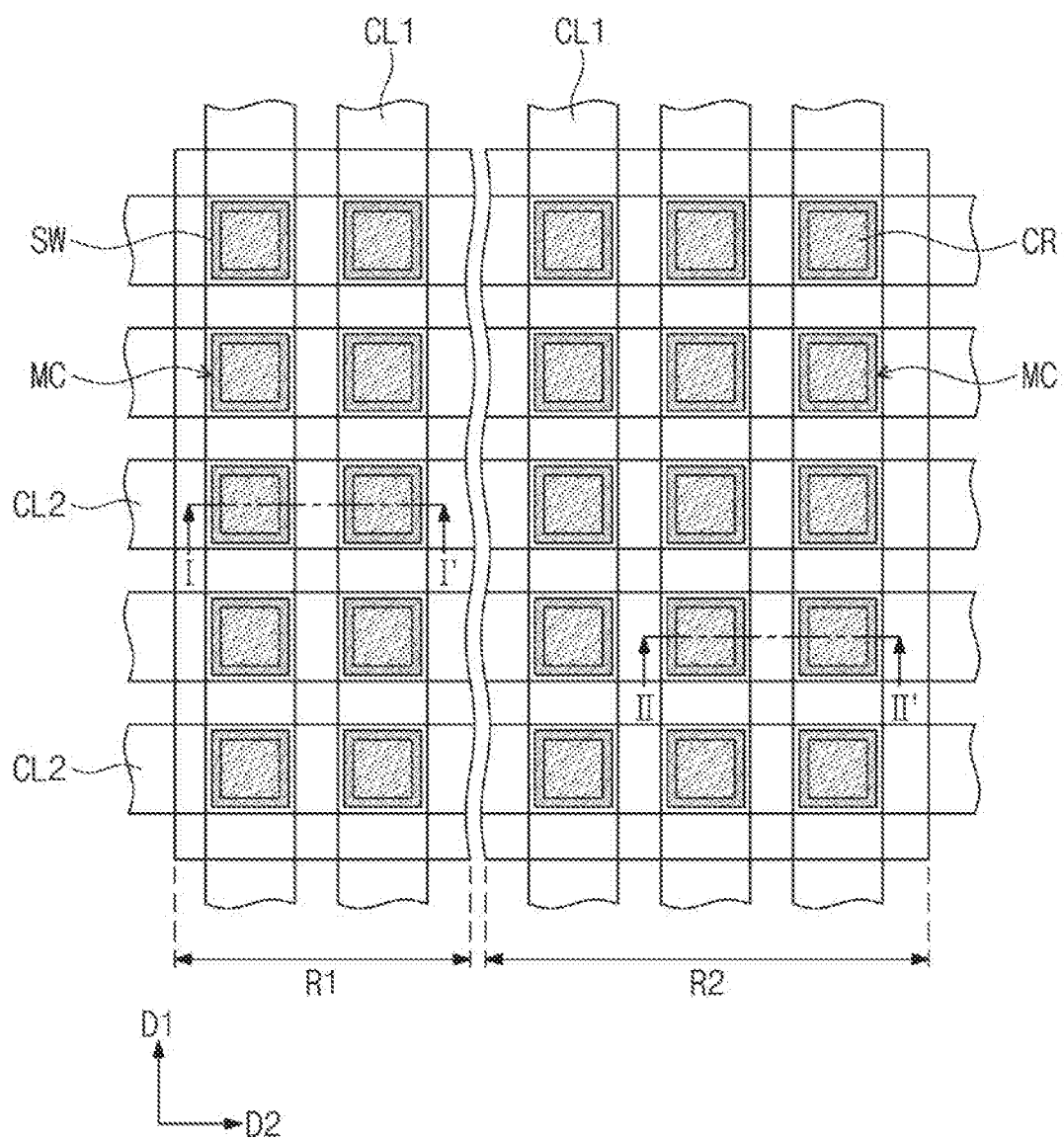
FIG. 4 is an enlarged view of section R of the variable resistance memory device of FIG. 3.
Figure 5:
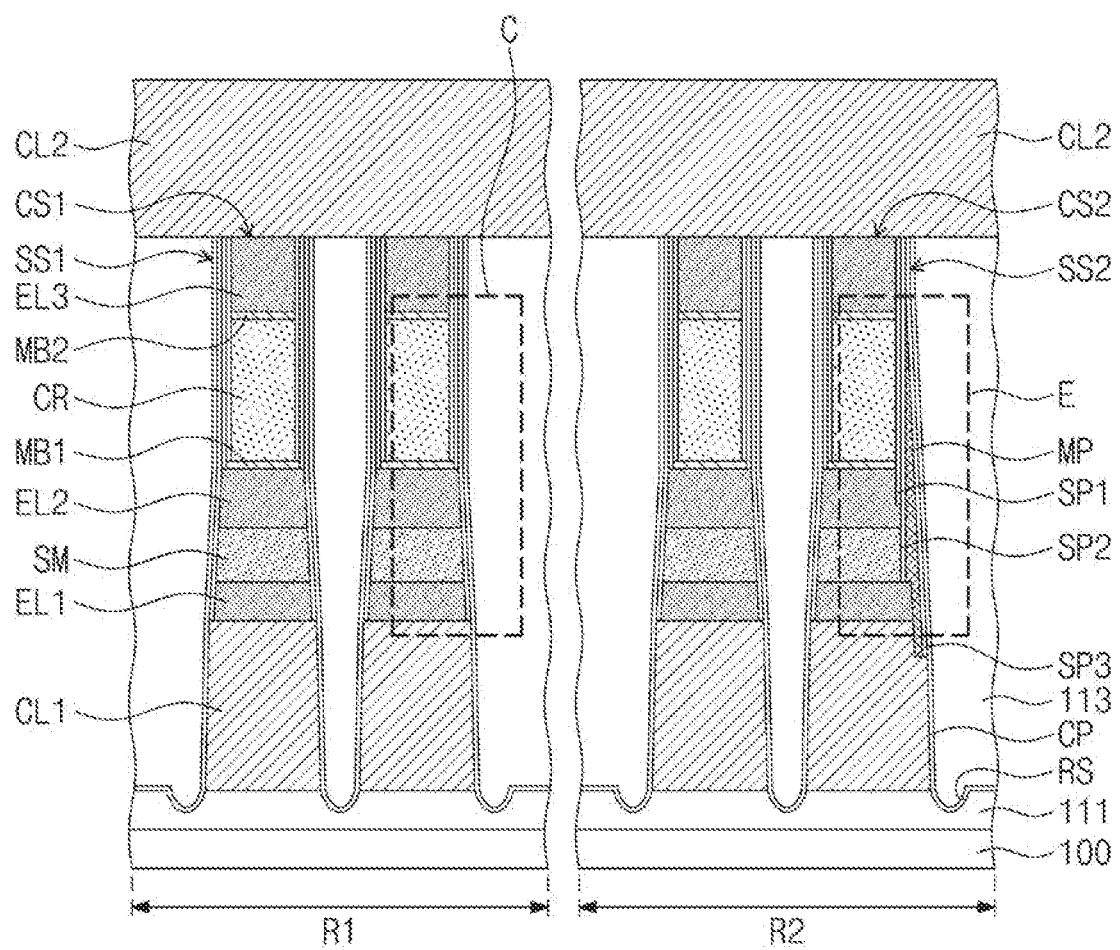
FIG. 5 is a cross-sectional view taken along lines I-I' and II-IF of the variable resistance memory device of FIG. 4.
Figure 6:
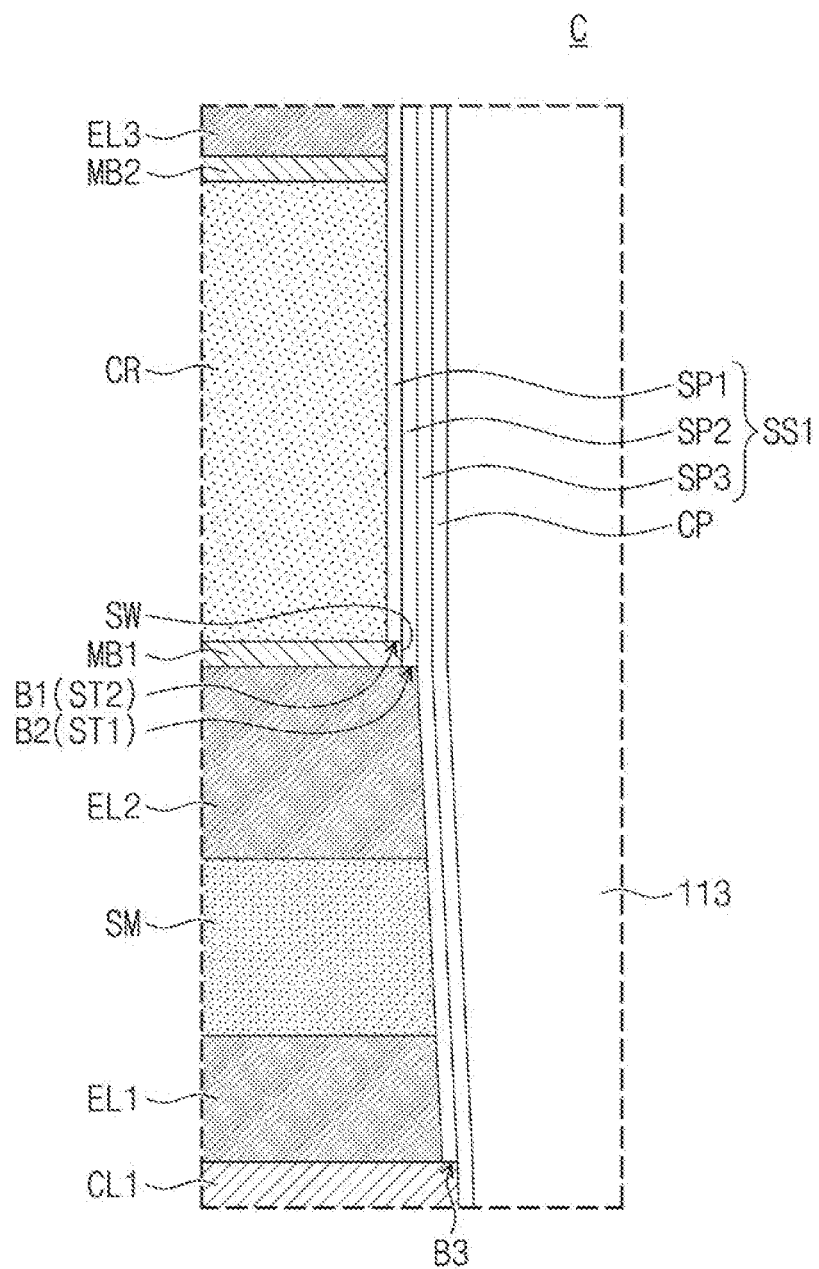
FIG. 6 is an enlarged view of section C of the variable resistance memory device of FIG. 5.
Figure 7:
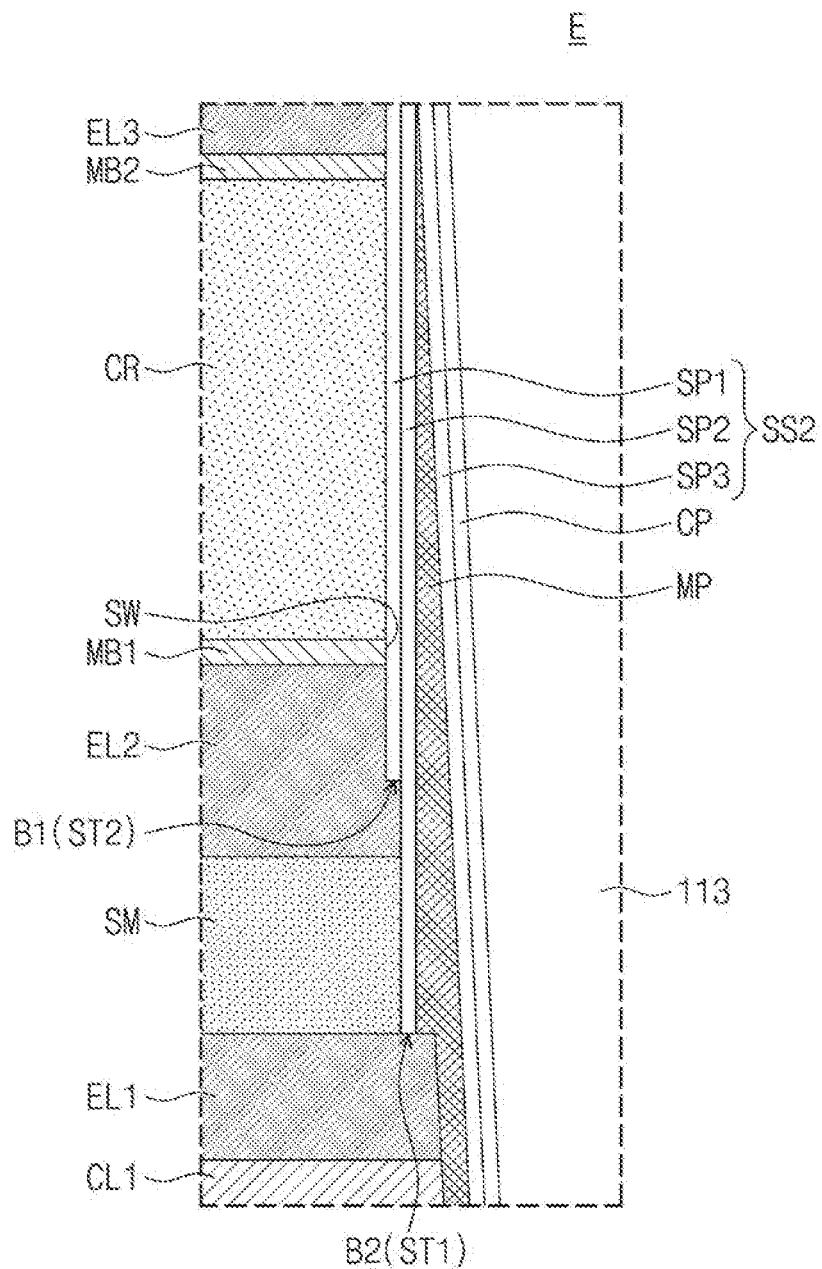
FIG. 7 is an enlarged view of section E of the variable resistance memory device of FIG. 5.

FIG. 3 is a plan view of a variable resistance memory device according to embodiments. FIG. 4 illustrates an enlarged view of section R of the variable resistance memory device of FIG. 3. FIG. 5 is a cross-sectional view taken along lines I-I' and II-IF of the variable resistance memory device of FIG. 4. FIG. 6 is an enlarged view of section C of the variable resistance memory device of FIG. 5. FIG. 7 is an enlarged view of section E of the variable resistance memory device of FIG. 5. FIGS. 5 to 7 each show a cross-section taken along a second direction, but a cross-section taken along a first direction may be the same as that taken along the second direction.

Referring to FIGS. 3 to 7, a substrate 100 may be provided that includes a cell array area CA and a peripheral circuit area PA. The cell array area CA and the peripheral circuit area PA may each include the substrate 100 and structures stacked on the substrate 100. Although the following will describe an example in which the cell array area CA and the peripheral circuit area PA are disposed laterally on a top surface of the substrate 100, the cell array area CA may be disposed on the peripheral circuit area PA.

The cell array area CA may include a plurality of memory cell stacks that are sequentially stacked. For example, the memory cell stack may be one of the memory cell stacks MCA discussed above with reference to FIG. 1. The memory cell stack may be disposed between the first conductive lines CL1 and second conductive lines CL2 that are sequentially provided on the substrate 100. The first conductive lines CL1 may extend along a first direction D1 substantially parallel to the top surface of the substrate 100, and the second conductive lines CL2 may extend along a second direction D2 that intersects the first direction D1 and is substantially parallel to the top surface of the substrate 100. The first and second conductive lines CL1 and CL2 may include a conductive material, such as tungsten, copper, or aluminum. The first and second conductive lines CL1 and CL2 may further include conductive metal nitride, such as TiN or WN.

A first interlayer dielectric layer 111 may be provided between the substrate 100 and the first conductive lines CL1. The first interlayer dielectric layer 111 may include one or more of silicon oxide, silicon nitride, and silicon oxynitride.

The peripheral circuit area PA may include peripheral logic circuits. For example, the peripheral circuit area PA may include row and column decoders, a page buffer, a control circuit, and the like. The peripheral circuit area PA may include NMOS and PMOS transistors, low- and high-voltage transistors, and a resistor that are integrated on the substrate 100.

A plurality of memory cells MC may be disposed at intersections between the first conductive lines CL1 and the second conductive lines CL2. The cell array area CA may include a first region R1 and a second region R2. The first region R1 may correspond to a central portion of the cell array area CA, and may be farther away than the second region R2 from the peripheral circuit area PA. The second region R2 may correspond to an edge portion of the cell array area CA, and may be closer than the first region R1 to the peripheral circuit area PA. The memory cells MC may include first cell structures CS1 in the first region R1 and second cell structures CS2 (outermost cells) in the second region R2. The second cell structures CS2 may be adjacent to the peripheral circuit area PA and may be considered to be disposed on an edge of the cell array area CA. One or more of the second cell structures CS2 may be dummy cells.

The memory cells MC may include switching elements SM between the first conductive lines CL1 and the second conductive lines CL2, and also include variable resistance patterns CR between the switching elements SM and the second conductive lines CL2. First electrodes EL1 may be provided between the switching elements SM and the first conductive lines CL1. First metal patterns MB1 may be provided between the switching elements SM and the variable resistance patterns CR. Second electrodes EL2 may be provided between the switching elements SM and the first metal patterns MB1. Third electrodes EL3 may be provided between the variable resistance patterns CR and the second conductive lines CL2. Second metal patterns MB2 may be provided between the third electrodes EL3 and the variable resistance patterns CR. For example, each of the memory cells MC may include the first electrode EL1, the switching element SM, the second electrode EL2, the first metal pattern MB1, the variable resistance pattern CR, the second metal pattern MB2, and the third electrode EL3 that are sequentially stacked on the first conductive lines CL1.

The following will describe an example in which the switching elements SM are disposed between the first electrodes EL1 and the second electrodes EL2, and the variable resistance patterns CR are disposed between the second electrodes EL2 and the third electrodes EL3, but alternatively the variable resistance patterns CR may be placed between the first electrodes EL1 and the second electrodes EL2, and the switching elements SM may be placed between the second electrodes EL2 and the third electrodes EL3.

The variable resistance elements CR may be formed of any one or any combination of materials having physical properties can store data. In the case in which a phase change memory device is adopted as the variable resistance memory device, the variable resistance patterns CR may include a material having phase is reversibly changed between a crystalline state and an amorphous state based on temperature. For example, the variable resistance patterns CR may have a phase transition temperature of about 250° C. to about 350° C. to induce a phase transition between the crystalline state and the amorphous state. The variable resistance patterns CR may be formed of a compound in which one or more of Te and Se as chalcogen elements are combined with one or more of Ge, Sb, Bi, Pb, Sn, Ag, As, S, Si, In, Ti, Ga, P, O, and C. For example, the variable resistance patterns CR may include one or more of GeSbTe, GeTeAs, SbTeSe, GeTe, SbTe, SeTeSn, SbSeBi, GeBiTe, GeTeTi, InSe, GaTeSe, and InSbTe. For another example, the variable resistance patterns CR may include a superlattice structure in which a Ge-containing layer and a Ge-free layer are repeatedly stacked. For example, the variable resistance patterns CR may include a structure in which a GeTe layer and a SbTe layer are repeatedly stacked.

In embodiments, the variable resistance patterns CR may include one or more of perovskite compounds and conductive metal oxides. For example, the variable resistance patterns CR may include one or more of niobium oxide, titanium oxide, nickel oxide, zirconium oxide, vanadium oxide, PCMO($(Pr,Ca)MnO_3$), strontium-titanium oxide, barium-strontium-titanium oxide, strontium-zirconium oxide, barium-zirconium oxide, and barium-strontium-zirconium oxide. When the variable resistance patterns CR include transition metal oxide, the variable resistance patterns CR may have a dielectric constant greater than that of a silicon oxide layer.

The switching elements SM may be an OTS (Ovonic Threshold Switch) device exhibiting bidirectional characteristics. For example, the switching elements SM may be devices based on a threshold switching phenomenon exhibiting a nonlinear I-V curve (e.g., S-type I-V curve). The switching elements SM may be associated with a phase transition temperature between crystalline and amorphous states that is greater than a phase transition temperature associated with the variable resistance patterns CR. For example, the switching elements SM may have a phase transition temperature of about 350° C. to about 450° C. Therefore, when operating the variable resistance memory device, the variable resistance patterns CR may be configured to reversibly change a phase between crystalline and amorphous states under operating voltage, while the switching elements SM may maintain a substantially amorphous state without the phase transition under the operating voltage. In this description, the phrase "substantially amorphous state" may not exclude the presence of a locally crystalline grain boundary or a locally crystalline portion in an object.

The switching elements SM may be formed of a compound in which one or more of Te and Se as chalcogen elements are combined with one or more of Ge, Sb, Bi, Al, Pb, Sn, Ag, As, S, Si, In, Ti, Ga and P. The switching elements SM may further include a thermal stabilization element in addition to the compound. The thermal stabilization element may be one or more of C, N, and O. For example, the switching elements SM may include one or more of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

The first, second, and third electrodes EL1, EL2, and EL3 may include a conductive material. For example, the first, second, and third electrodes EL1, EL2, and EL3 may be a carbon-containing electrode. The first, second, and third electrodes EL1, EL2, and EL3 may include one or more of metal and metal nitride. Each of the first electrodes EL1 may have a width less than or substantially the same as that of the first conductive line CL1 provided thereunder.

The first metal patterns MB1 and the second metal patterns MB2 may cover top and bottom surfaces of the variable resistance patterns CR, thereby preventing diffusion of materials included in the variable resistance patterns CR. In addition, the first metal patterns MB1 may be provided between the variable resistance patterns CR and the switching elements SM, thereby improving contact resistances. The first and second metal patterns MB1 and MB2 may include one or more of W, Ti, Al, Cu, C, CN, TiN, TiAlN, TiSiN, TiCN, WN, CoSiN, WSiN, TaN, TaCN, and TaSiN.

The memory cells MC may include spacer structures SS1 and SS2. The spacer structures SS1 and SS2 may include first spacer structures SS1 on sidewalls of the first cell structures CS1 and second spacer structures SS2 on sidewalls of the second cell structures CS2. The spacer structures SS1 and SS2 may cover sidewalls of the variable resistance patterns CR. For example, each of the first and second the spacer structures SS1 and SS2 may include a first spacer SP1, a second spacer SP2, and a third spacer SP3 that sequentially cover the sidewall of the variable resistance pattern CR.

The first spacer structure SS1 will be further discussed in detail below.

The first spacer SP1 of the first spacer structure SS1 may expose a sidewall SW of the first metal pattern MB1. The first spacer SP1 may have a lower sidewall aligned with the sidewall SW of the first metal pattern MB1. The first spacer SP1 may have a bottom surface B1 in contact with a top surface of the first metal pattern MB1. For example, the first spacer structure SS1 may have a second step structure ST2 on the top surface of the first metal pattern MB1. The first spacer SP1 may extend from the top surface of the first metal pattern MB1 to a top surface of the third electrode EL3.

The second spacer SP2 may cover a sidewall of the first spacer SP1 and the sidewall SW of the first metal pattern MB1. The second spacer SP2 may have a bottom surface B2 in contact with a top surface of the second electrode EL2. The bottom surface B2 of the second spacer SP2 may be higher than a top surface of the switching element SM. For example, the first spacer structure SS1 may have a first step structure ST1 on the top surface of the second electrode EL2. The bottom surface B2 of the second spacer SP2 may be located at a level the same as that of an uppermost surface of the second electrode EL2 and higher than that of a lowermost surface of the second electrode EL2. The first step structure ST1 may be located at a level lower than that of the uppermost surface of the second electrode EL2 and higher than that of the lowermost surface of the second electrode EL2. The first step structure ST1 and the second step structure ST2 may be disposed along a direction, which is perpendicular to the top surface of the substrate 100, on an inner sidewall of the first spacer structure SS1.

The third spacer SP3 may cover a sidewall of the second spacer SP2 and a sidewall of the switching element SM. The third spacer SP3 may cover a sidewall of the first electrode EL1. For example, the third spacer SP3 may have a bottom surface B3 in contact with top surfaces of the first conductive lines CL1. In this case, the bottom surface B3 of the third spacer SP3 may be located at a level the same as or lower than that of uppermost surfaces of the first conductive lines CL1.

The second spacer structure SS2 will be further discussed in detail below.

The first spacer SP1 of the second spacer structure SS2 may expose a sidewall SW of the first metal pattern MB1. The first spacer SP1 may have a bottom surface B1 lower than a top surface of the second electrode EL2 and higher than a bottom surface of the second electrode EL2. For example, the second spacer structure SS2 may have a second step structure ST2 at a level of the second electrode EL2. The second step structure ST2 may be located at a level lower than that of the top surface of the second electrode EL2 and higher than that of the bottom surface of the second electrode EL2.

The second spacer SP2 may cover a sidewall of the first spacer SP1 and a sidewall of the switching element SM. The second spacer SP2 may have a bottom surface B2 at a level the same as that of an uppermost surface of the first electrode EL1 and higher than that of a lowermost surface of the first electrode EL1. For example, the second spacer structure SS2 may have a first step structure ST1 on a top surface of the first electrode EL1. The first step structure ST1 may be located at a level the same as that of a top surface of the first electrode EL1 and higher than that of a bottom surface of the first electrode EL1. The first step structure ST1 and the second step structure ST2 may be disposed along a direction, which is perpendicular to the top surface of the substrate 100, on an inner sidewall of the second spacer structure SS2.

The second spacer structure SS2 may include a conductive polymer layer MP between the second spacer SP2 and the third spacer SP3. The conductive polymer layer MP may cover the sidewall of the switching element SM. The conductive polymer layer MP may cover a sidewall of the first electrode EL1 and a sidewall of the second electrode EL2. The conductive polymer layer MP may be in contact with sidewall of the first electrode EL1. The second spacer SP2 may separate the conductive polymer layer MP from the switching element SM and the second electrode EL2. The conductive polymer layer MP may extend onto a sidewall of the variable resistance pattern CR. The conductive polymer layer MP may also be provided between the first and second spacers SP1 and SP2 of the first spacer structures SS1.

The conductive polymer layer MP may be a re-deposited layer of etch byproducts (residue) that are produced in an etching process that will be discussed below. For example, the conductive polymer layer MP may include a metallic material, such as tungsten, titanium, and tantalum. The second spacer SP2 may cover the sidewall of the switching element SM to separate the switching element SM from the conductive polymer layer MP, with the result that the first electrode EL1 and the second electrode E2 may be prevented from their bridging without the switching element SM.

The third spacer SP3 may cover the conductive polymer layer MP. The third spacer SP3 may have a bottom surface at a level the same as or lower than that of a bottom surface of the conductive polymer layer MP. For example, the bottom surface of the third spacer SP3 may be in contact with the first conductive lines CL1.

One or more of the first to third spacers SP1 to SP3 may include a different material from those of others of the first to third spacers SP1 to SP3. For example, the first spacer SP1 may be an oxide layer, and the second and third spacers SP2 and SP3 may be a nitride layer. In this case, the first spacer SP1 may include silicon oxide. The second and third spacers SP2 and SP3 may include one or more of silicon nitride and silicon oxynitride.

The first spacer SP1 may have a thickness of about 10 Å to about 20 Å. The second spacer SP2 may have a thickness of about 10 Å to about 20 Å. The third spacer SP3 may be thicker than the first and second spacers SP1 and SP2. For example, the third spacer SP3 may have a thickness of about 20 Å to about 30 Å.

A capping layer CP may be provided to cover sidewalls of the memory cells MC. For example, the capping layer CP may be in contact with sidewalls of the third spacer SP3 of the memory cells MC. The capping layer CP may extend onto sidewalls of the first conductive lines CL1. For example, the capping layer CP may cover exposed recess regions RS on an upper portion of the first interlayer dielectric layer 111 between the first conductive lines CL1. The capping layer CP may include one or more of silicon nitride and silicon oxynitride. The capping layer CP may be thicker than the third spacer SP3. For example, the capping layer CP may have a thickness of about 25 Å to about 60 Å.

A buried dielectric layer 113 may be provided to fill gaps between the memory cells MC. The buried dielectric layer 113 may include silicon nitride. For example, the buried dielectric layer 113 may include a layer of $Si_3N_4$. The buried dielectric layer 113 may include a low-k dielectric layer. For example, the buried dielectric layer 113 may include one or more of silicon oxycarbide, silicon oxycarbonitride, and silicon carbonitride.

Figure 8:
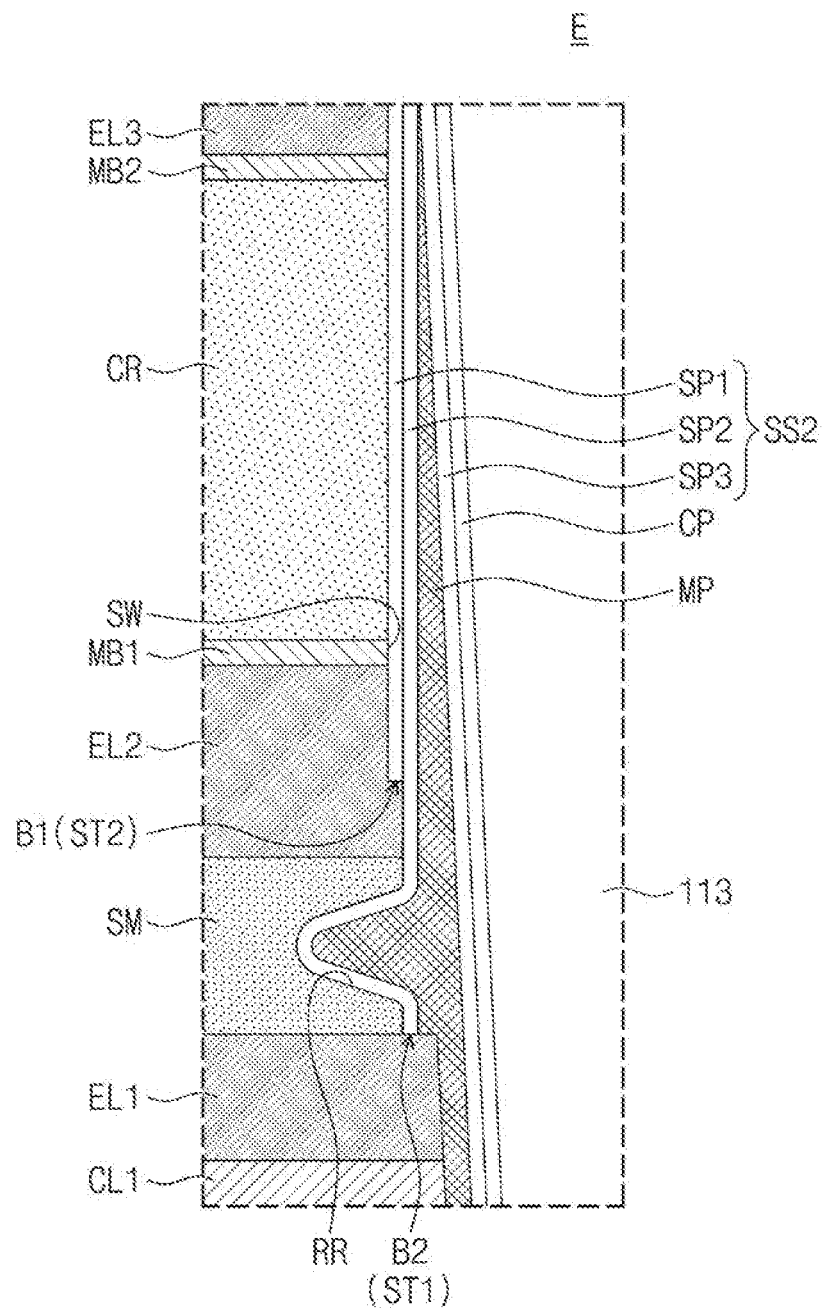
FIG. 8 is an enlarged view of another example of the section E of the variable resistance memory device of FIG. 5.

FIG. 8 is an enlarged view of another example of the section E of the variable resistance memory device of FIG. 5. In embodiments, the sidewall of the switching element SM may include a dent region RR that is recessed inwardly. The dent region RR may be created when the peripheral circuit area PA is over-etched than the cell array area CA at the time of forming the switching element SM in the following method to fabricate a variable resistance memory device. The second spacer SP2 may conformally cover the dent region RR, and the conductive polymer layer MP may extend to the dent region RR.

The spacer structures SS1 and SS2 may prevent chemical elements contained in the switching elements SM or the variable resistance patterns CR from being volatilized due to heat generated in manufacturing processes or in use after fabrication. In addition, degradation of electrical characteristics may be prevented that is caused when impurities combine with chemical elements contained in the switching elements SM or the variable resistance patterns CR.

In embodiments, the second spacer SP2 may cover the sidewall SW of the first metal pattern MB1 such that the variable resistance pattern CR may be prevented from damage, degradation, and/or electrical short that possibly occur when the switching element SM is patterned in fabrication processes that will be discussed below. In addition, the second spacer SP2 may prevent an increase in bridging or current leakage caused by the conductive polymer layer MP.

Figure 9:
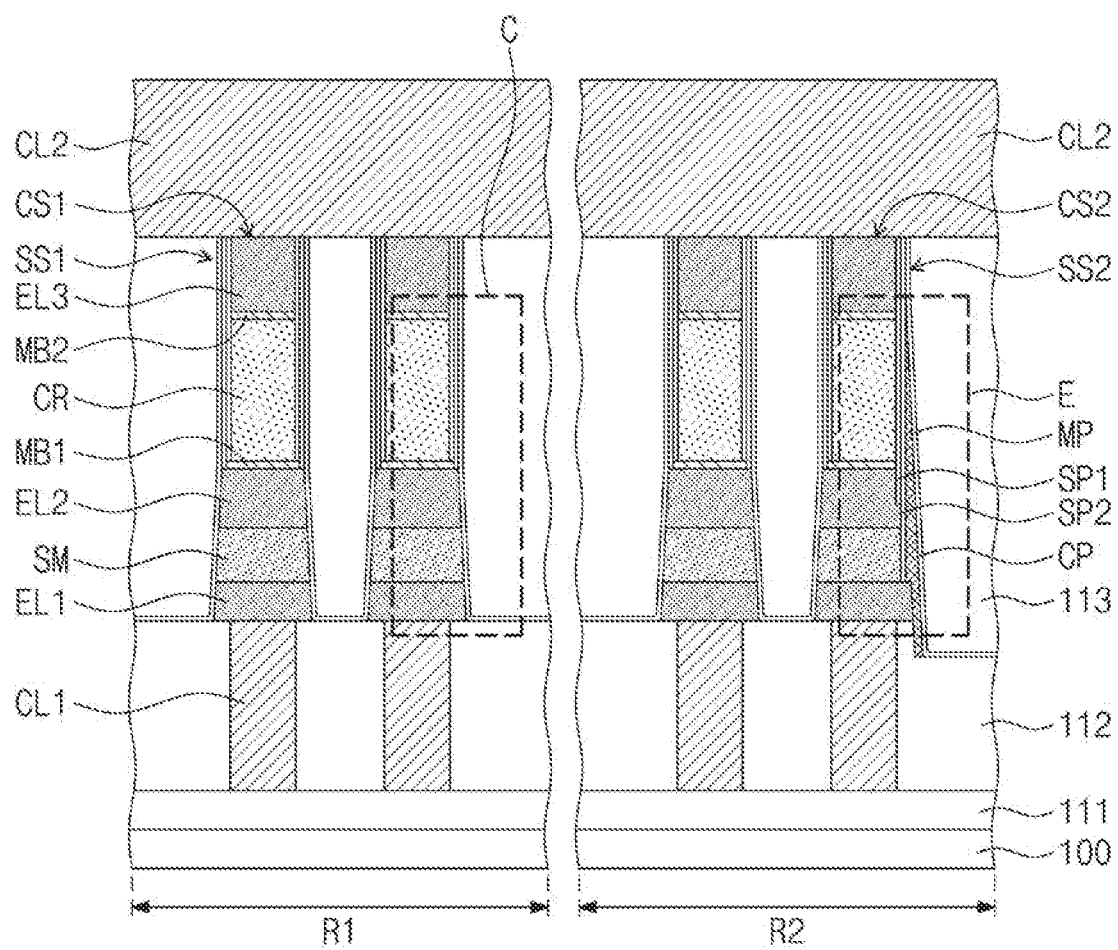
FIG. 9 is a cross-sectional view taken along lines I-I' and II-IF of another example of the variable resistance memory device of FIG. 4.
Figure 10:
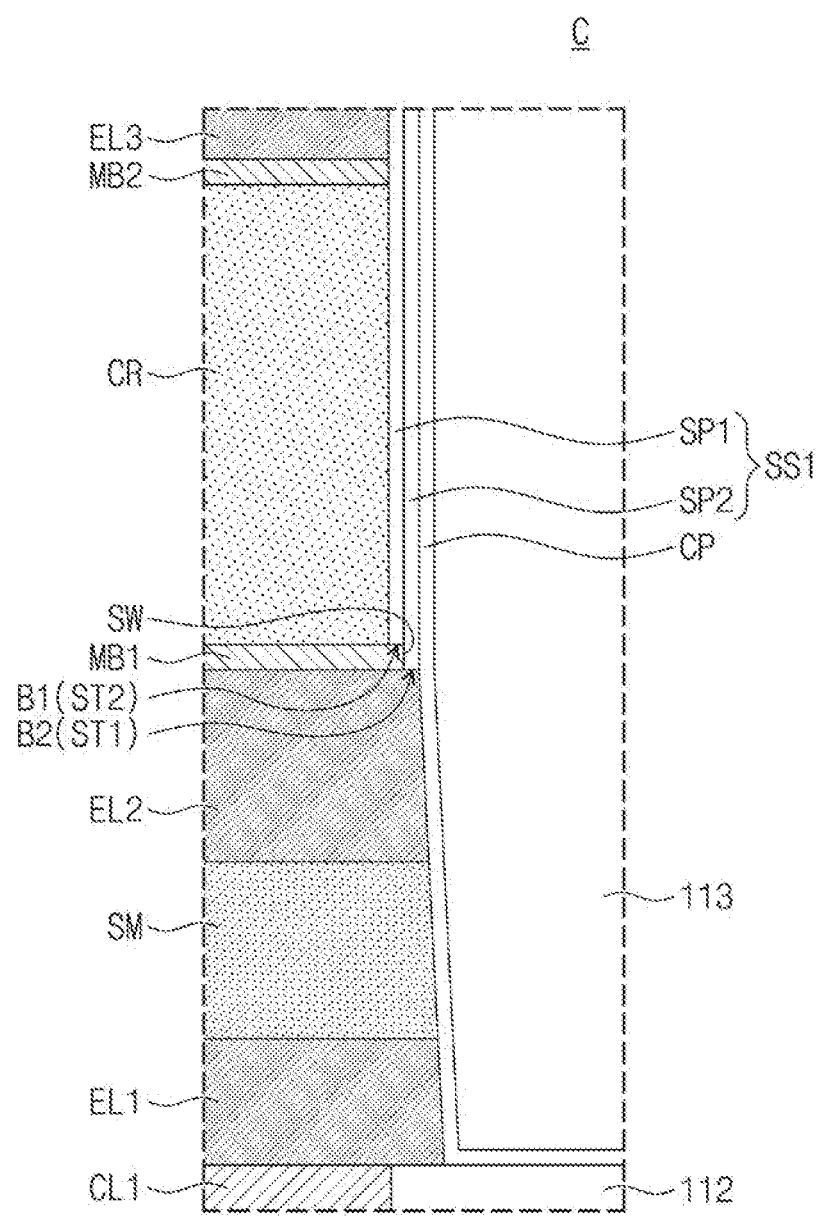
FIG. 10 is an enlarged view of section C of the variable resistance memory device of FIG. 9.
Figure 11:
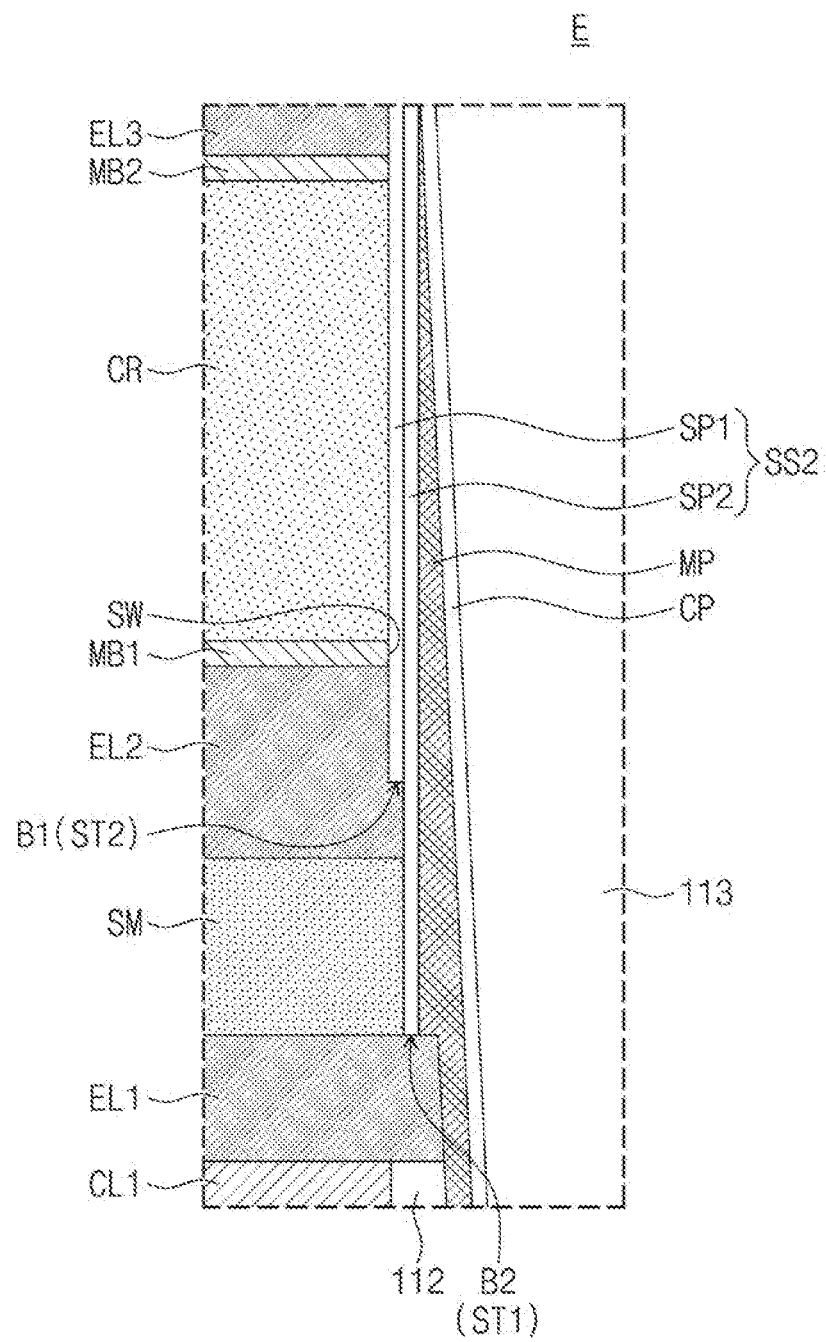
FIG. 11 is an enlarged view of section E of the variable resistance memory device of FIG. 9.

FIG. 9 is a cross-sectional view taken along lines I-I' and II-IF of another example of the variable resistance memory device of FIG. 4. FIG. 10 is an enlarged view of section C of the variable resistance memory device of FIG. 9. FIG. 11 is an enlarged view of section E of the variable resistance memory device of FIG. 9. For brevity of the description, an explanation of duplicate components will be omitted.

Referring to FIGS. 9 to 11, each of the first electrodes EL1 may have a width greater than that of the first conductive line CL1 provided thereunder. Differently from the embodiments of FIGS. 3 to 7, the first conductive lines CL1 may be patterned earlier than and separately from their overlying memory cells MC, and therefore, the first conductive lines CL1 may be formed prior to the formation of the memory cells MC. The first conductive lines CL1 may be provided in a second interlayer dielectric layer 112 on the first interlayer dielectric layer 111.

The spacer structures SS1 and SS2 may include no third spacer SP3 discussed with reference to FIGS. 3 to 7. The second spacer SP2 may be in contact with the capping layer CP. The capping layer CP may extend along a top surface of the second interlayer dielectric layer 112. In the first region R1, the capping layer CP may be in contact with the sidewall of each of the first electrode ELL the switching element SM, and the second electrode EL2. In the second region R2, the capping layer CP may be in contact with a sidewall of the conductive polymer layer MP.

Figure 12:
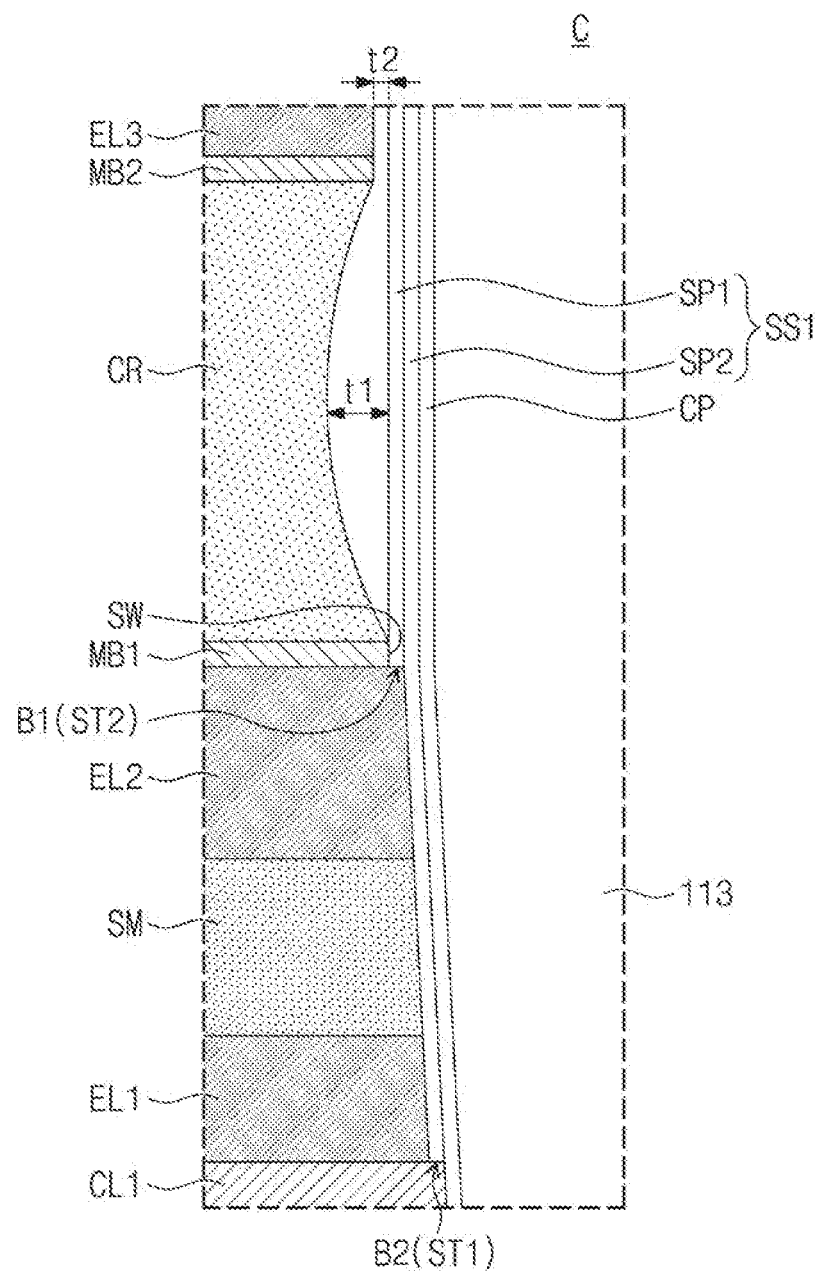
FIGS. 12 and 13 are enlarged views respectively of other examples of the sections C and E of the variable resistance memory device of FIG. 5.
Figure 13:
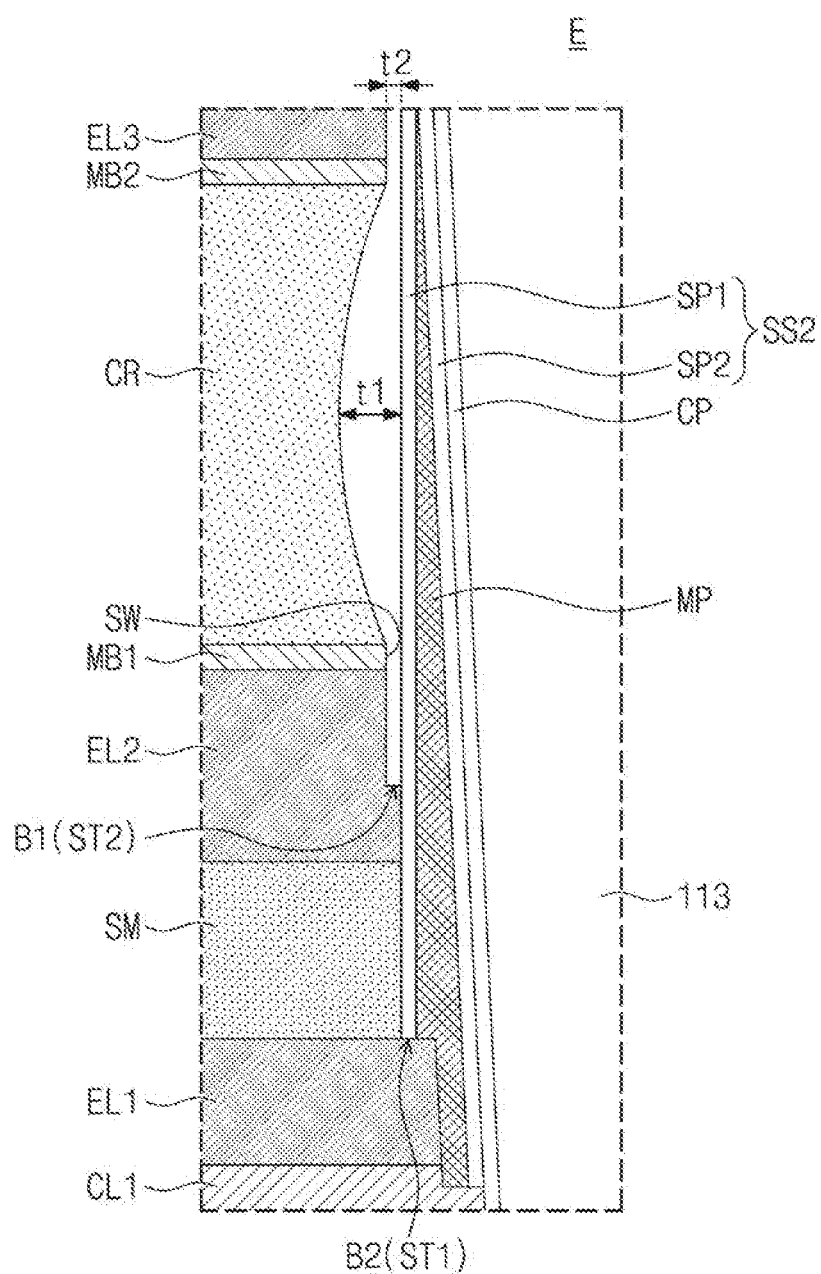

FIGS. 12 and 13 are enlarged views respectively of other examples of the sections C and E of the variable resistance memory device of FIG. 5.

Referring to FIGS. 12 and 13, the variable resistance patterns CR may include recess parts on the sidewalls thereof. The recess parts may each be a region produced when the sidewall of the variable resistance pattern CR is recessed inwardly from the sidewall SW of the first metal pattern MB1 and a sidewall of the second metal pattern MB2. For example, the recess parts may be formed by performing a wet cleaning process that uses a cleaning solution having an etch selectivity with respect to the variable resistance patterns CR.

The first spacer SP1 may fill the recess parts. The first spacer SP1 may have a thickness t1 at its portion that fills the recess part, and the thickness t1 may be greater than those of other portions of the first spacer SP1. For example, the thickness t1 of the portion that fills the recess part may be greater than a thickness t2 of the first spacer SP1 on the sidewall of the second metal pattern MB2.

FIGS. 14, 15, 16, 17, 18, 19, 20 and 21 are cross-sectional views taken along lines I-I' and II-IF of the variable resistance memory device of FIG. 4, showing a method of fabricating the variable resistance memory device, according to embodiments.

Figure 14:
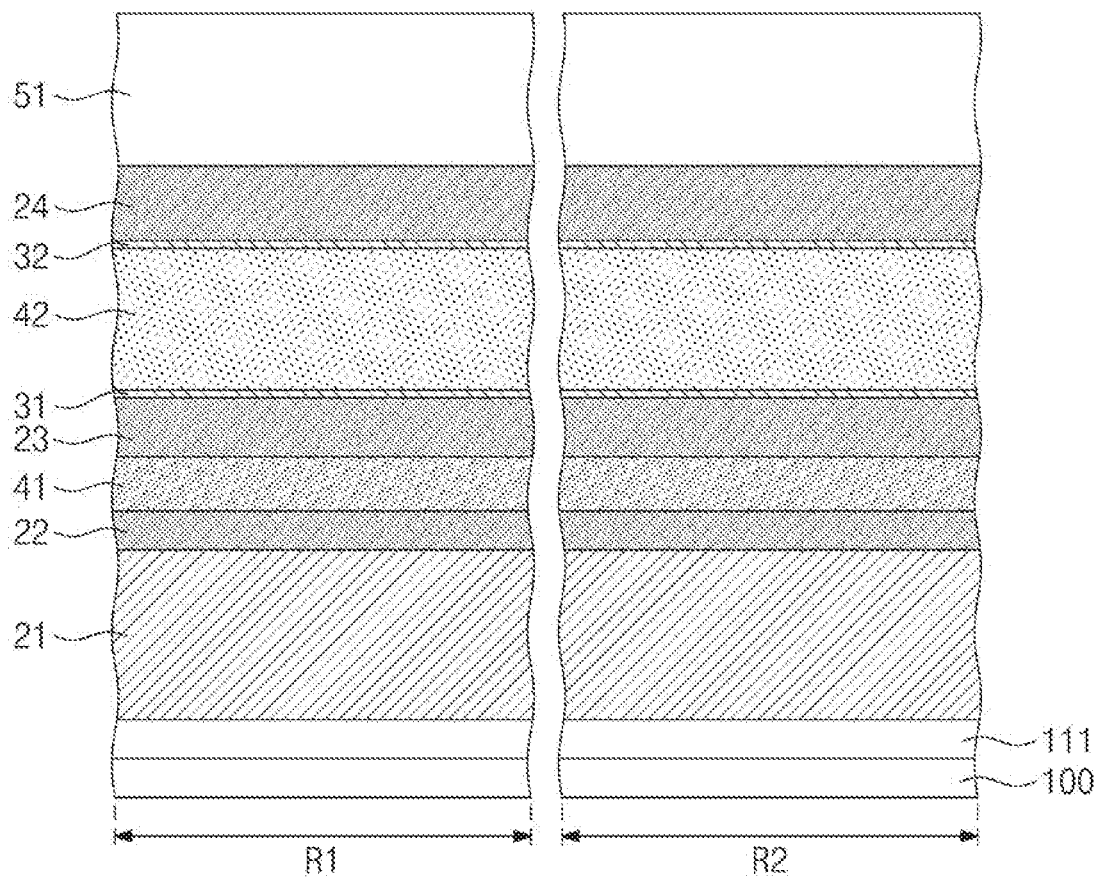
FIGS. 14, 15, 16, 17, 18, 19, 20 and 21 are cross-sectional views taken along lines I-I' and II-II' of the variable resistance memory device of FIG. 4, showing a method of fabricating the variable resistance memory device, according to embodiments.

Referring to FIGS. 4 and 14, a first interlayer dielectric layer 111, a first conductive layer 21, a second conductive layer 22, a switching layer 41, a third conductive layer 23, a first metal layer 31 a variable resistance layer 42, a second metal layer 32, and a fourth conductive layer 24 may be sequentially provided on a substrate 100 that includes a first region R1 and a second region R2. For example, the formation of the layers mentioned above may include performing one or more of chemical vapor deposition, sputtering deposition, and atomic layer deposition. A mask layer 51 may be provided on the fourth conductive layer 24. The mask layer 51 may include one or more of a silicon nitride layer, a silicon carbide layer, and a silicon oxynitride layer.

Figure 15:
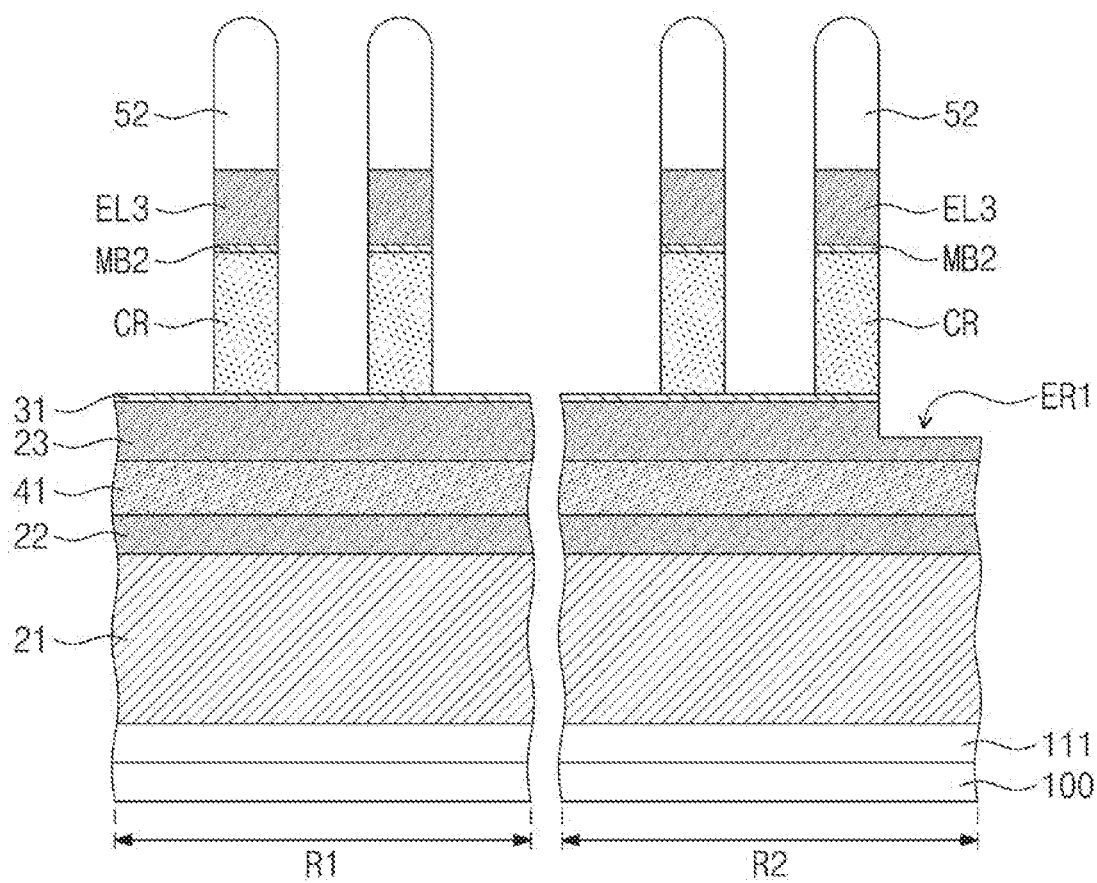

Referring to FIGS. 14 and 15, the mask layer 51 may be patterned into mask patterns 52, and then the mask patterns 52 may be used as an etching mask to sequentially pattern the fourth conductive layer 24, the second metal layer 32, and the variable resistance layer 42. As a result, variable resistance patterns CR, second metal patterns MB2, and third electrodes EL3 may be sequentially formed on the first metal layer 31. For example, the mask patterns 52 may be spaced apart from each other in a first direction D1 and a second direction D2. Alternatively, the mask patterns 52 may each have a linear shape extending in the first direction D1 and may be spaced apart from each other in the second direction D2.

The variable resistance patterns CR, the second metal patterns MB2, and the third electrodes EL3 may be formed by performing an anisotropic etching process having directionality is excellent. For example, the etching process may include one or more of ion beam etching and reactive ion etching.

During the etching process, no first metal layer 31 may be patterned in the first region R1. The second region R2 may be a region that corresponds to an edge portion of the cell array area (see CA of FIG. 3) and is adjacent to the peripheral circuit area (see PA of FIG. 3) on which no memory cells are formed, and therefore, relatively large intervals may be established between patterns formed by the etching process. As a result, compared to the first region R1, the second region R2 may be etched at a high rate due to an etch loading effect. Therefore, the first metal layer 31 may be etched in the second region R2. For example, an upper portion of the third conductive layer 23 below the first metal layer 31 may also be etched to form a first etching region ER1 on the upper portion of the third conductive layer 23. In embodiments, the first etching region ER1 may penetrate the third conductive layer 23 to expose the switching layer 41.

Figure 16:
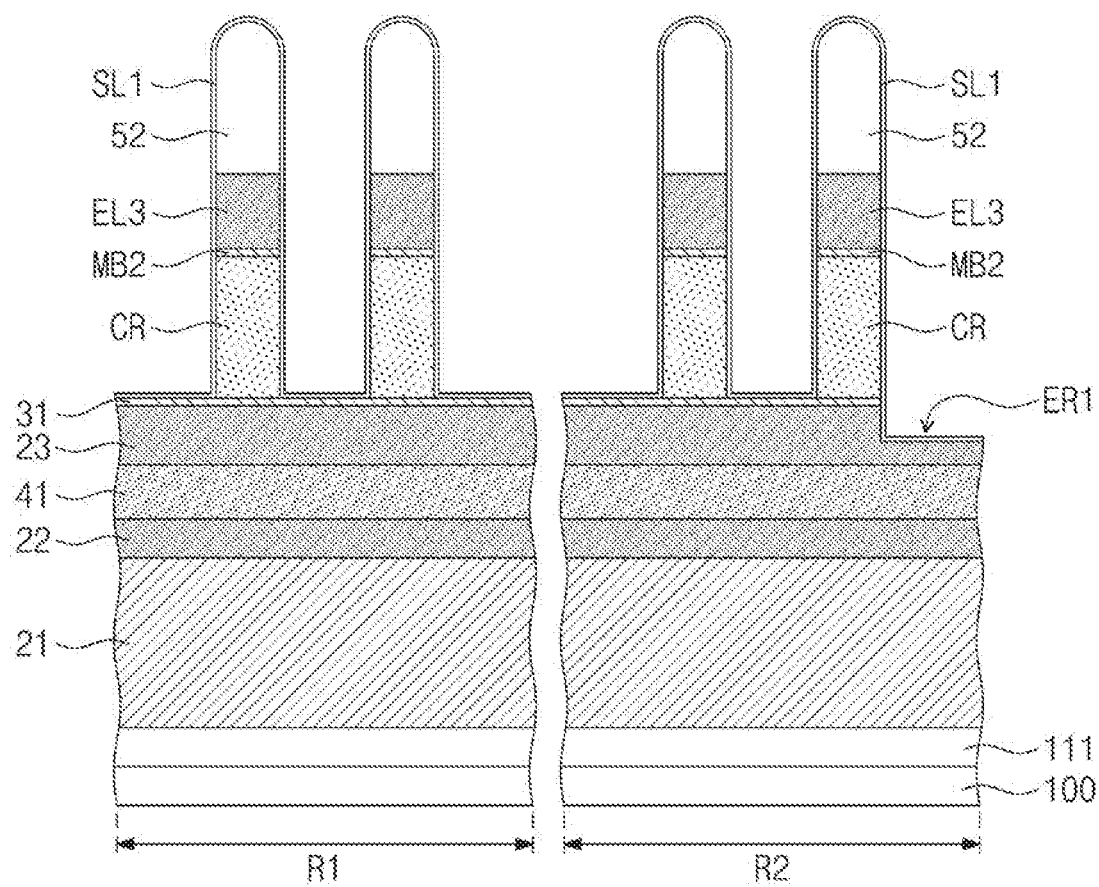

Referring to FIGS. 14 and 16, a first spacer layer SL1 may be formed to cover the patterned structure discussed above with reference to FIG. 15. The first spacer layer SL1 may cover sidewalls of the variable resistance patterns CR, sidewalls of the second metal patterns MB2, and sidewalls of the third electrodes EL3. In addition, the first spacer layer SL1 may conformally cover the first etching region ER1 and a top surface of the first metal layer 31. The first spacer layer SL1 may include silicon oxide. The first spacer layer SL1 may be formed by one or more of atomic layer deposition and chemical vapor deposition.

Figure 17:
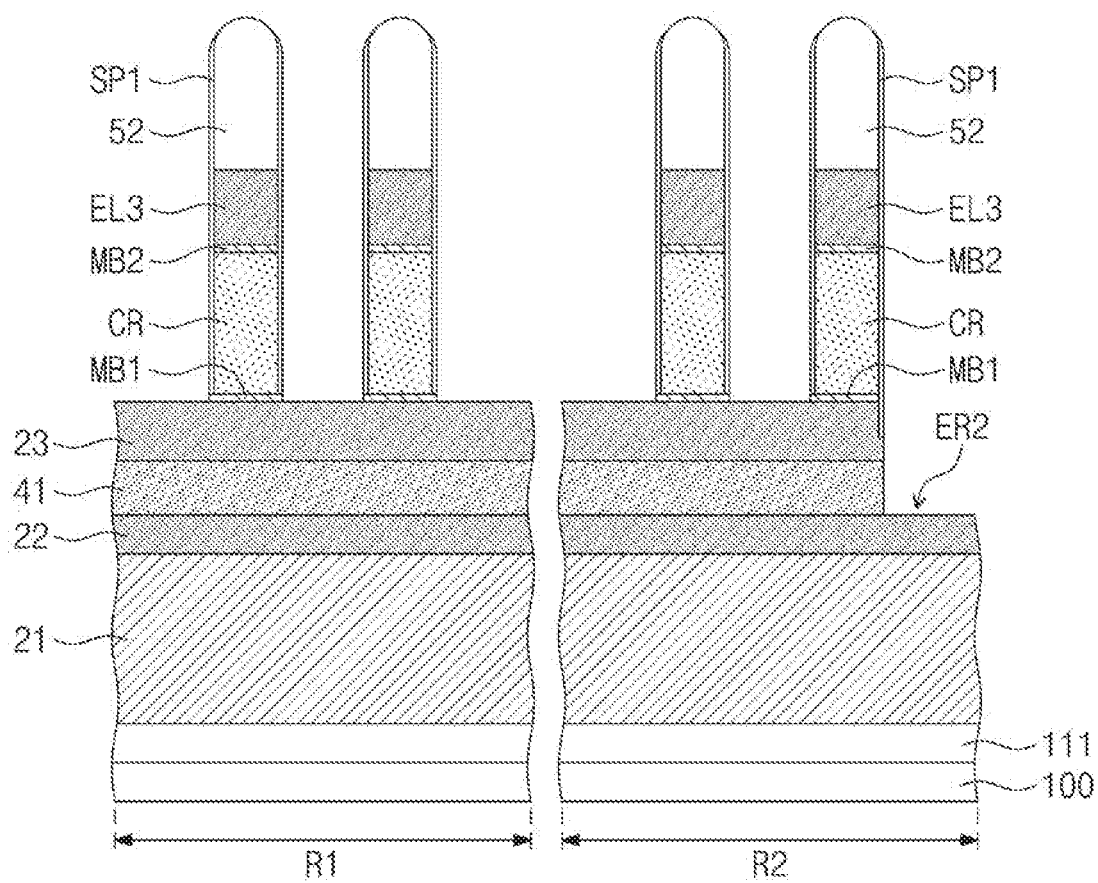

Referring to FIGS. 14 and 17, the first spacer layer SL1 may undergo an etching process to form first spacers SP1. For example, the etching process may include one or more of ion beam etching and reactive ion etching. While the first spacers SP1 are formed, the first metal layer 31 may be patterned to form first metal patterns MB1 that are separated from each other below each variable resistance pattern CR. A portion of the first spacer SP1 formed in the second region R2 may have a bottom surface that is disposed in the third conductive layer 23. The first spacers SP1 may expose top surfaces of the mask patterns 52.

During the etching process, the first etching region ER1 may extend in a direction toward the substrate 100 and thus a second etching region ER2 may be formed. The second etching region ER2 may expose at least a portion of a sidewall of the switching layer 41. For example, the second etching region ER2 may expose a top surface of the second conductive layer 22.

Figure 18:
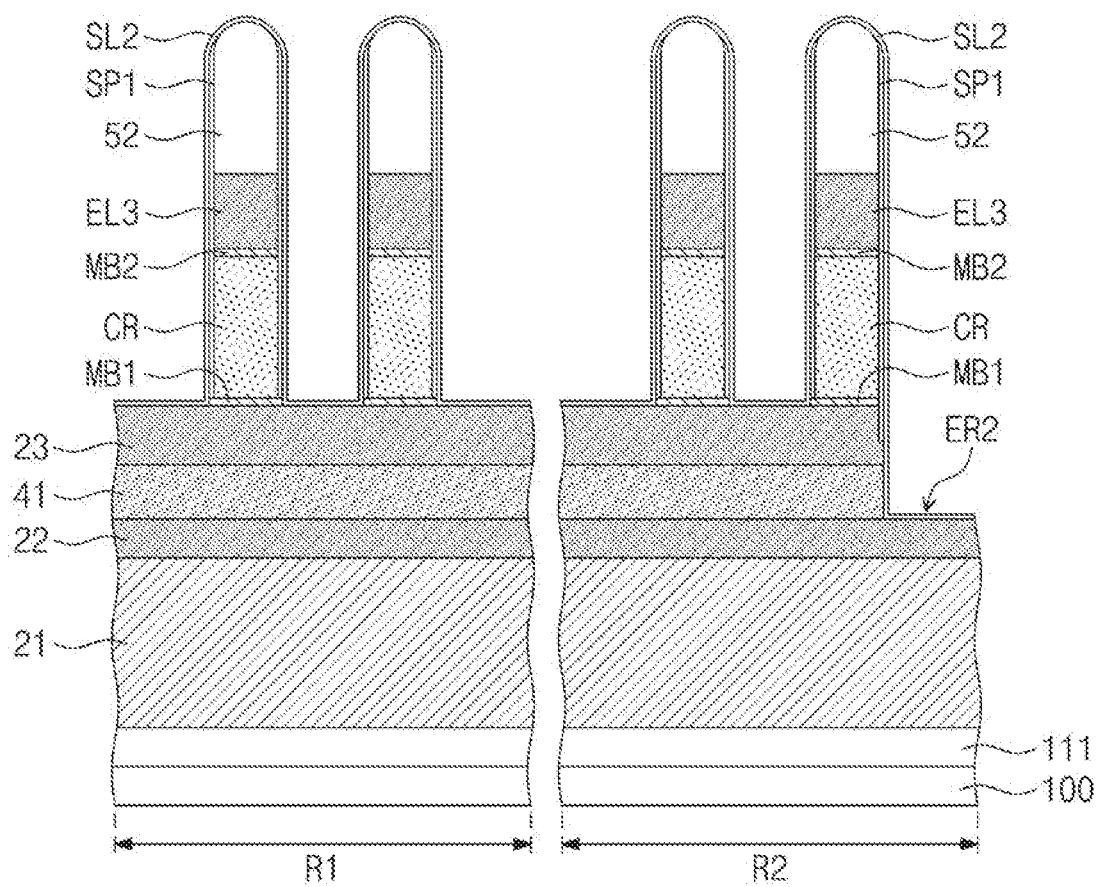

Referring to FIGS. 4 and 18, a second spacer layer SL2 may be formed to cover the first spacers SP1. The second spacer layer SL2 may cover exposed sidewalls of the first metal patterns MB1. The second spacer layer SL2 may conformally cover the second etching region ER2 (including a sidewall of the third conductive layer 23, a sidewall of the switching layer 41 and a top surface of the second conductive layer 22) and a top surface of the third conductive layer 23. The second spacer layer SL2 may include one or more of silicon nitride, silicon oxide, and silicon oxynitride. The second spacer layer SL2 may be formed by one or more of atomic layer deposition and chemical vapor deposition.

Figure 19:
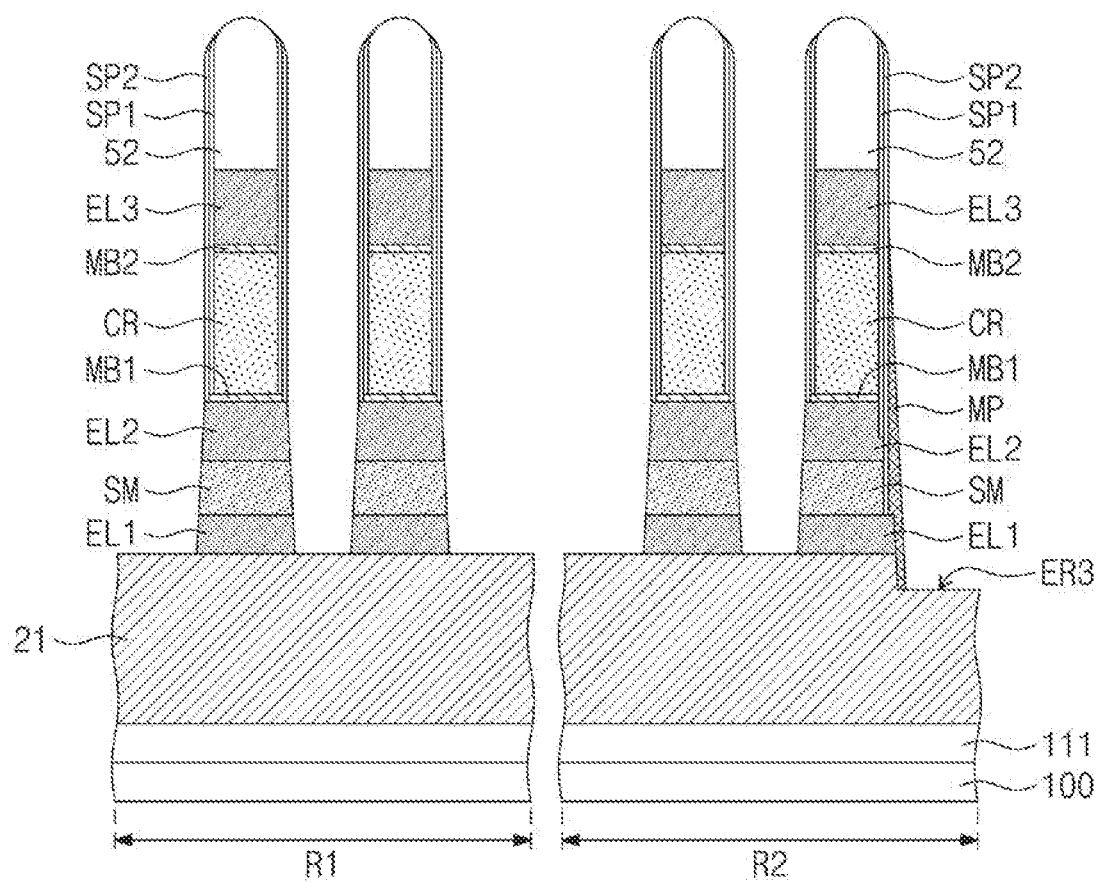

Referring to FIGS. 4 and 19, the second spacer layer SL2 may undergo an etching process to form second spacers SP2. In the second region R2, the second spacers SP2 may have their bottom surfaces in contact with the top surface of the second conductive layer 22. In the first region R1, the second spacers SP2 may have their bottom surfaces in contact with the top surface of the third conductive layer 23.

The third conductive layer 23, the switching layer 41, and the second conductive layer 22 may be sequentially etched to form second electrodes EL2, switching elements SM, and first electrodes EL1. The etching process may be performed simultaneously with the formation of the second spacers SP2. For example, the etching process may include one or more of ion beam etching and reactive ion etching. During the etching process, the second etching region ER2 may extend in a direction toward the substrate 100 and thus a third etching region ER3 may be formed. The third etching region ER3 may be formed on an upper portion of the first conductive layer 21. For example, the third etching region ER3 may have a bottom surface lower than an uppermost surface of the first conductive layer 21.

During the etching process, a conductive polymer layer MP may be formed on sidewalls of the second spacers SP2. Although, as shown, the conductive polymer layer MP is formed on the sidewalls of the second spacers SP2 in the second region R2, the conductive layer MP may also be formed on sidewalls of the second spacers SP2 in the first region R1. In this case, the conductive polymer layer MP on the sidewalls of the second spacers SP2 in the first region R1 may have a thickness less than that of the conductive polymer layer MP on the sidewalls of the second spaces SP2 in the second region R2.

The conductive polymer layer MP may extend along sidewalls of the variable resistance patterns CR, sidewalls of the first metal patterns MB1, sidewalls of the second electrodes EL2, sidewalls of the switching elements SM, and sidewalls of the first electrodes EL1. For example, the conductive polymer layer MP may be in contact with the sidewalls of the first electrode EL1 and/or with the first conductive layer 21 exposed to the third etching region ER3.

The conductive polymer layer MP may be a re-deposited layer of etch byproducts (residue) combined with metal elements produced from the first conductive layer 21 that is etched simultaneously due to an etch loading effect. The second spacer SP2 may separate the conductive polymer layer MP from the switching element SM and the second electrode EL2. Thus, the second spacer SP2 may prevent the conductive polymer layer MP from being a bridge that connects the second electrode EL2 to the first electrode EL1 and causes an outermost cell switching operation to fail.

The second spacer SP2 may cover the sidewall of the first metal pattern MB1, which sidewall is not covered with the first spacer SP1, and thus when patterning the third conductive layer 23, the switching layer 41, and the second conductive layer 22, the second spacer SP2 may prevent metal elements produced from the first metal pattern MB1 from being combined with other etch byproducts and re-deposited on the sidewall of the first metal pattern MB1.

Figure 20:
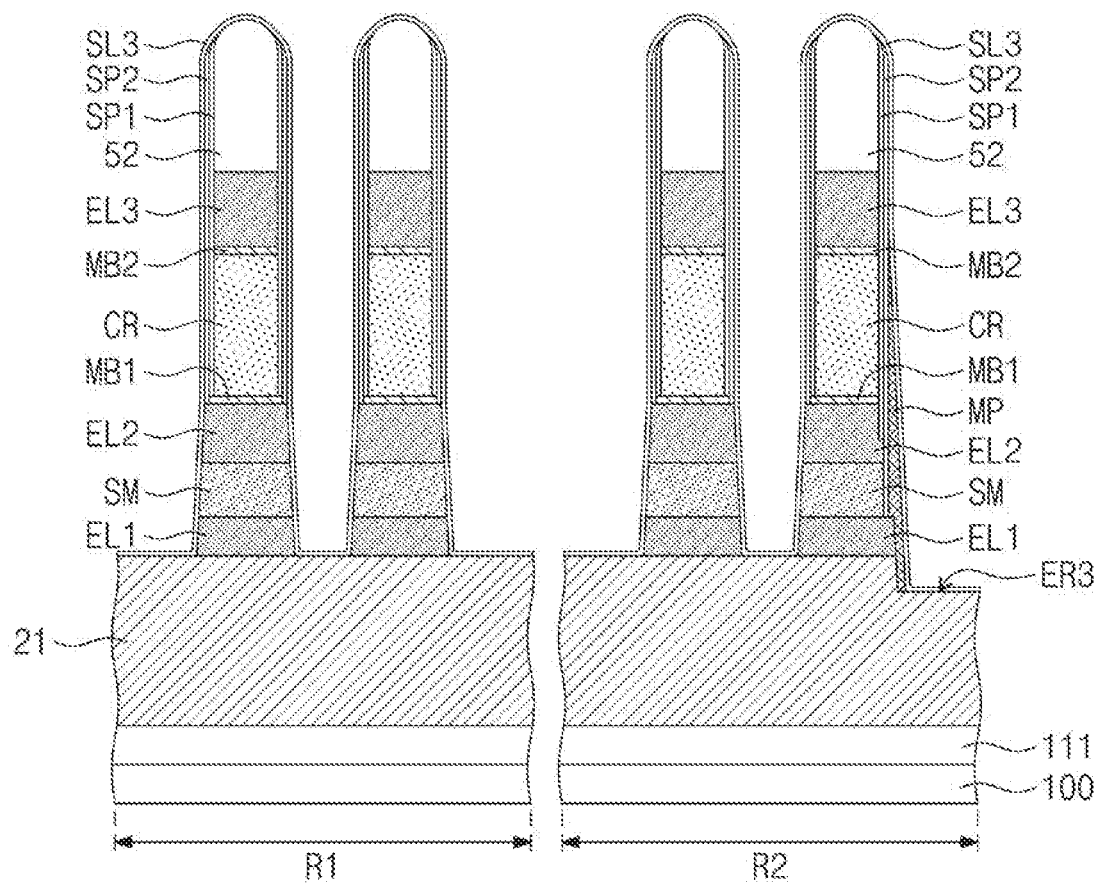

Referring to FIGS. 14 and 20, a third spacer layer SL3 may be formed to cover the patterned structure as discussed with reference to FIG. 19. Because the switching element SM has constituent elements vulnerable to a wet etching process due to their relatively low volatilization temperature, the third spacer layer SL3 may be formed without performing a cleaning process that removes the conductive polymer layer MP. The third spacer layer SL3 may cover the exposed sidewalls of the first electrodes EL1, the exposed sidewalls of the switching elements SM, and the exposed sidewalls of the second electrodes EL2. The third spacer layer SL3 may conformally cover the conductive polymer layer MP and a top surface of the first conductive layer 21. The third spacer layer SL3 may include one or more of silicon nitride, silicon oxide, and silicon oxynitride. The third spacer layer SL3 may be formed by one or more of atomic layer deposition and chemical vapor deposition.

Figure 21:
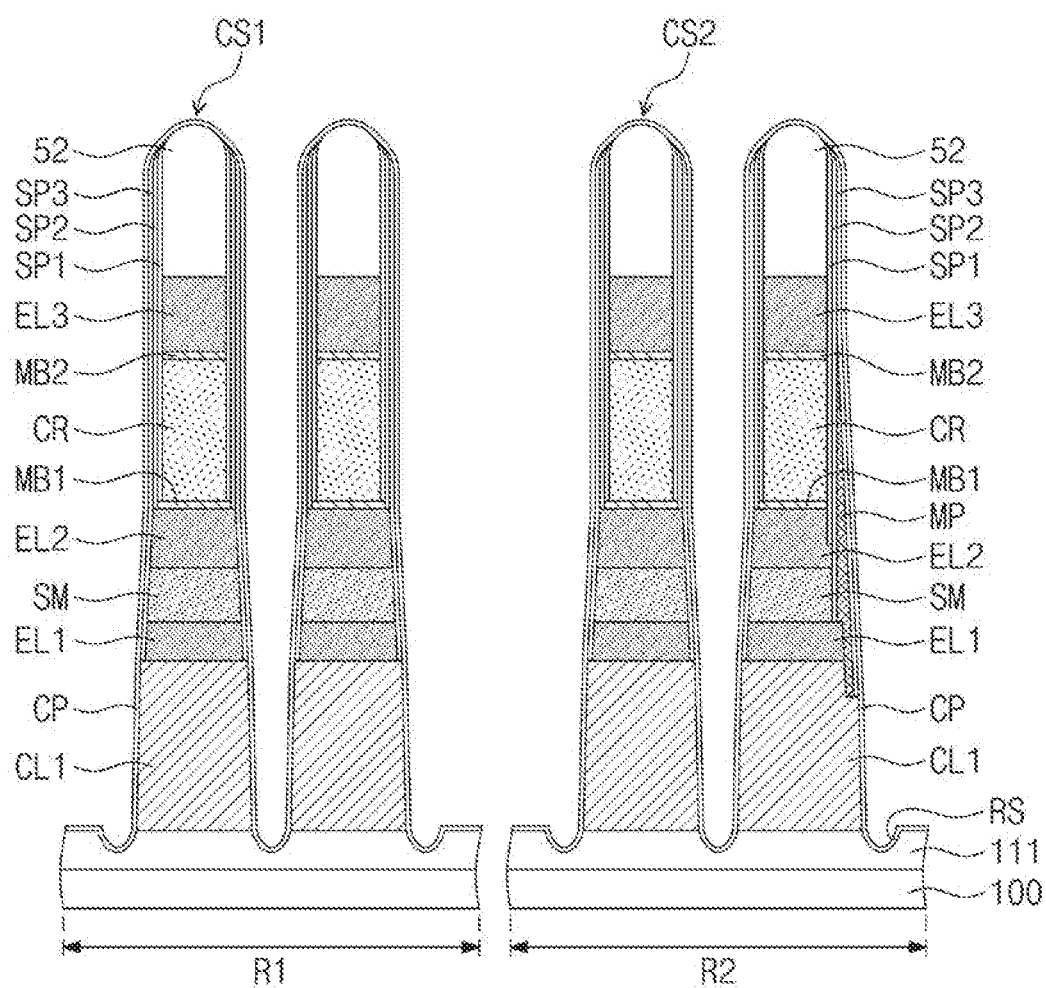

Referring to FIGS. 4 and 21, the third spacer layer SL3 may undergo an etching process to form third spacers SP3. In the second region R2, the third spacers SP3 may have their bottom surfaces lower than the uppermost surface of the first conductive layer 21. In the first region R1, the third spacers SP3 may have their bottom surfaces in contact with the top surface of the first conductive layer 21.

An etching process may be performed in which the first conductive layer 21 is etched to form first conductive lines CL1. The etching process may be performed simultaneously with the formation of the third spacers SP3. For example, the etching process may include one or more of ion beam etching and reactive ion etching. Owing to the etching process, first cell structures CS1 may be eventually formed in the first region R1 and second cell structures CS2 may be eventually formed in the second region R2. During the etching process, an upper portion of the first interlayer dielectric layer 111 may also be etched to from recess regions RS.

A capping layer CP may be formed to cover the first and second cell structures CS1 and CS2. The capping layer CP may cover sidewalls of the first and second cell structures CS1 and CS2, and may also cover an exposed top surface of the first interlayer dielectric layer 111 between the first and second cell structures CS1 and CS2. The capping layer CP may include one or more of silicon nitride and silicon oxynitride. The capping layer CP may be formed by one or more of atomic layer deposition and chemical vapor deposition.

Referring back to FIGS. 4 and 5, a buried dielectric layer 113 may be formed to fill gaps between the first and second cell structures CS1 and CS2. For example, the buried dielectric layer 113 may include a layer of $Si_3N_4$. The buried dielectric layer 113 may include a low-k dielectric layer. For example, the buried dielectric layer 113 may include one or more of silicon oxycarbide, silicon oxycarbonitride, and silicon carbonitride. Thereafter, a planarization process may be performed to remove the mask patterns 52 and to expose the third electrodes EL3.

As discussed above, when the mask patterns 52 each have a linear shape extending in the first direction D1 and are spaced apart from each other in the second direction D2, an additional patterning process may be performed. For example, an additional patterning process may be executed to separate the first and second cell structures CS1 and CS2 from each other in the first direction D1. The additional patterning process may be substantially the same as that discussed above with reference to FIGS. 14 to 21. Alternatively, when the mask patterns 52 are spaced apart from each other in the first and second directions D1 and D2, no additional patterning process may be performed.

Second conductive lines CL2 may be formed on the third electrodes EL3. Each of the second conductive lines CL2 may extend in the second direction D2 and may have connection with a plurality of third electrodes EL3. The formation of the second conductive lines CL2 may include forming a conductive layer on the third conductive electrodes EL3 and patterning the conductive layer. Afterwards, an interlayer dielectric layer may be formed to fill gaps between the second conductive lines CL2.

According to embodiments, the second spacer SP2 may separate the switching element SM from the conductive polymer layer MP, and may prevent metal elements produced from the first metal patterns MB1 from being re-deposited when an etching process is performed.

Figure 22:
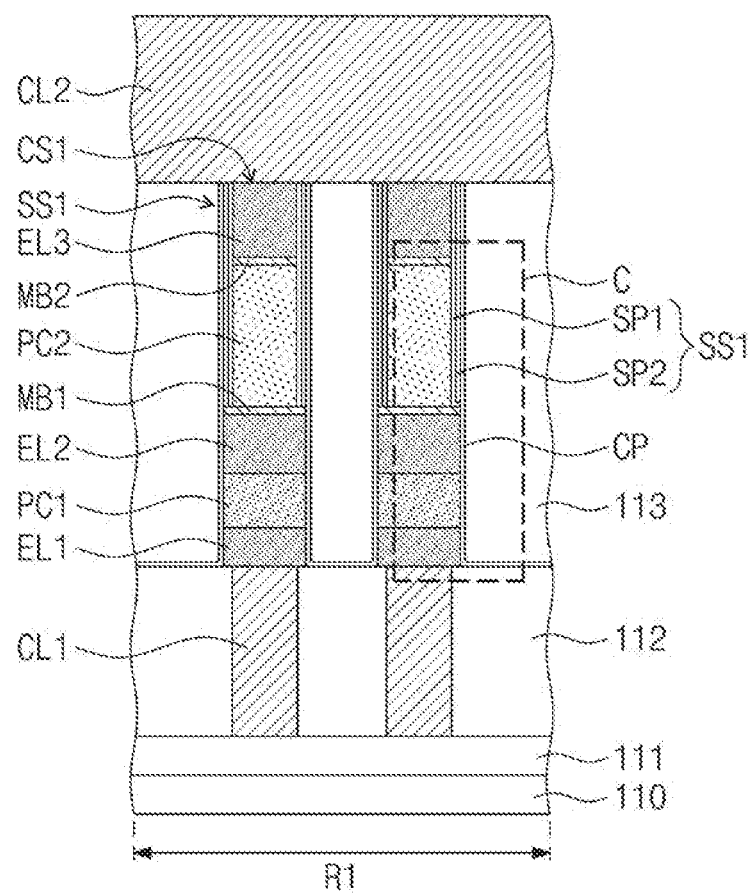
FIG. 22 is a cross-sectional view taken along line I-I' of another example of the variable resistance memory device of FIG. 4.
Figure 23:
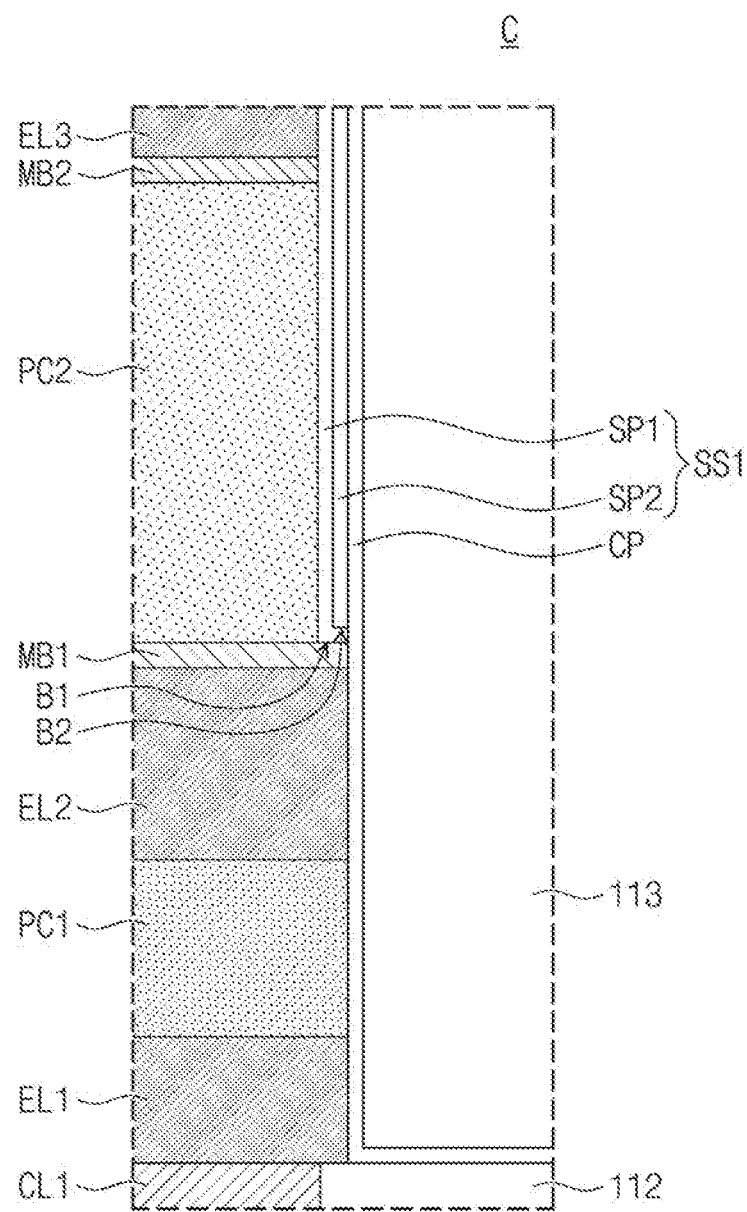
FIG. 23 is an enlarged view of section C of the variable resistance memory device of FIG. 22.

FIG. 22 is a cross-sectional view taken along line I-I' of another example of the variable resistance memory device of FIG. 4. FIG. 23 is an enlarged view of section C of the variable resistance memory device of FIG. 22. For brevity of the description, an explanation of duplicate components will be omitted.

Referring to FIGS. 22 and 23, the first cell structures CS1 may be provided between the first conductive lines CL1 and the second conductive lines CL2. The first conductive lines CL1 may be provided in the second interlayer dielectric layer 112 on the first interlayer dielectric layer 111. Each of the first electrodes EL1 may have a width greater than that of the first conductive line CL1 provided thereunder. The first spacer structures SS1 may include the first spacer SP1 and the second spacer SP2, but may include no third spacer. The second spacer SP2 may be in contact with the capping layer CP.

The first cell structures CS1 may include first phase change patterns PC1 between the first electrodes EL1 and the second electrodes EL2, and also include second phase change patterns PC2 between the second electrodes EL2 and the third electrodes EL3. For example, one of the first phase change pattern PC1 and the second phase change pattern PC2 may be a switching element, and the other of the first phase change pattern PC1 and the second phase change pattern PC2 may be a variable resistance pattern.

The first spacer SP1 may include substantially no oxygen, except for unintentional impurities. For example, the first spacer SP1 may be a silicon nitride layer. The second spacer SP2 may include oxygen. For example, the second spacer SP2 may be one or more of a silicon oxide layer and a silicon oxynitride layer. The capping layer CP may have a larger density and a greater resistance to wet etching than those of the first and second spacers SP1 and SP2. For example, the capping layer CP may include one or more of SiN, SiON, SiCN, SiBN, and AlN.

The bottom surface B1 of the first spacer SP1 may be lower than the bottom surface B2 of the second spacer SP2. For example, the first spacer SP1 may have a lower portion that extends downwardly below the bottom surface B2 of the second spacer SP2.

Figure 24:
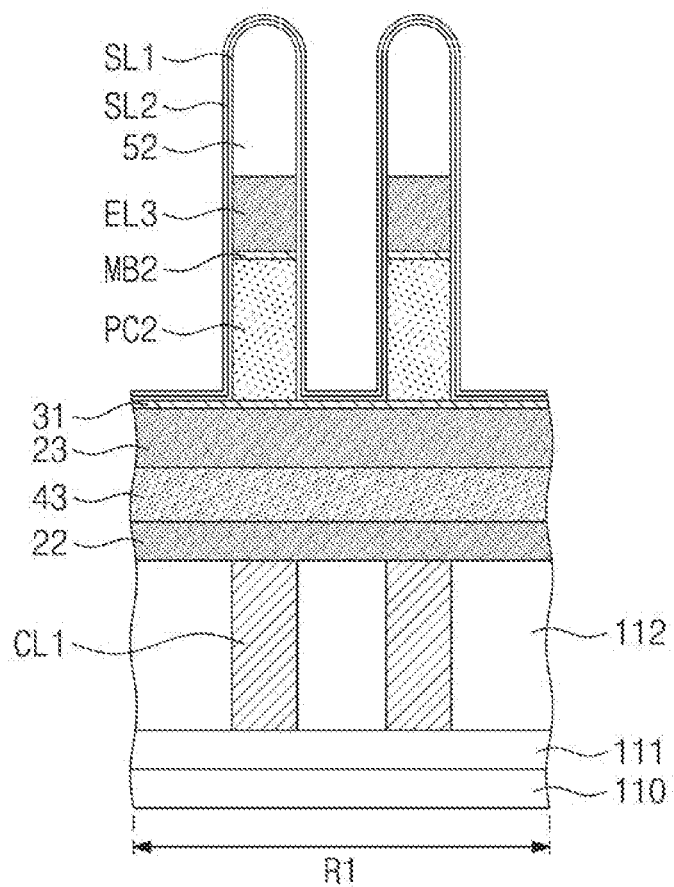
FIGS. 24, 25 and 26 are cross-sectional views taken along line I-I' of the variable resistance memory device of FIG. 4, showing a method of fabricating the variable resistance memory device depicted in FIGS. 22 and 23.
Figure 25:
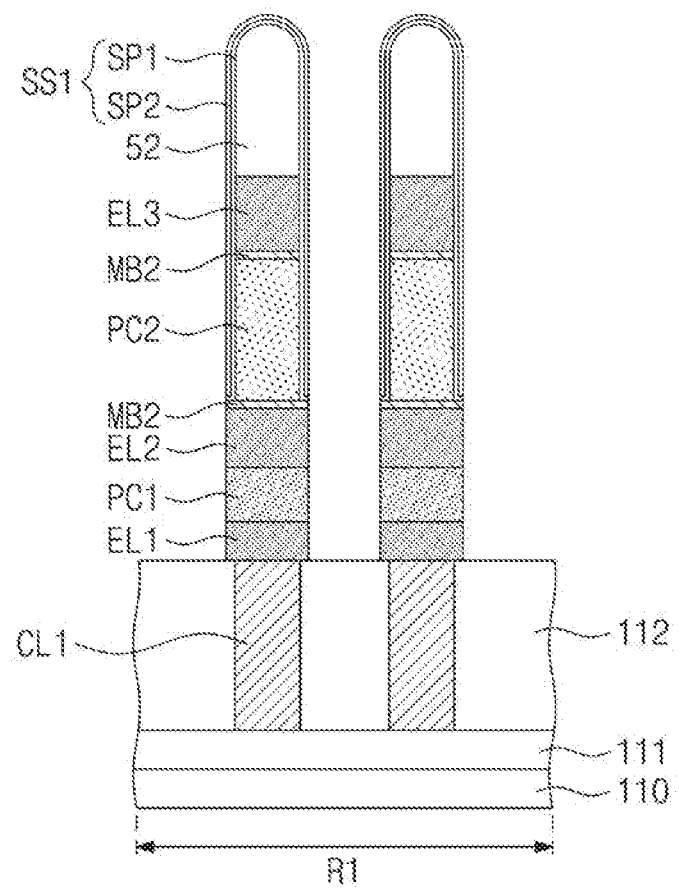
Figure 26:
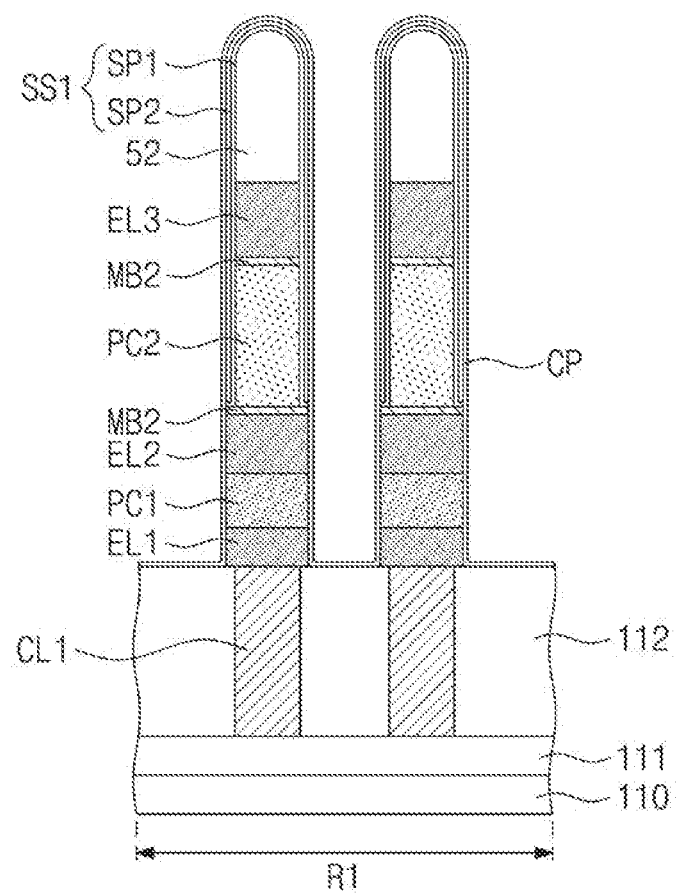

FIGS. 24, 25 and 26 are cross-sectional views taken along line I-I' of the variable resistance memory device of FIG. 4, showing a method of fabricating the variable resistance memory device depicted in FIGS. 22 and 23.

Referring to FIG. 24, a second conductive layer 22, a first phase change layer 43, a third conductive layer 23, and a first metal layer 31 may be provided on the first conductive lines CL1 and the second interlayer dielectric layer 112. For example, the formation of the layers mentioned above may include performing one or more of chemical vapor deposition, sputtering deposition, and atomic layer deposition. A second phase change layer, a second metal layer, a fourth conductive layer, and mask patterns 52 may be sequentially formed on the first metal layer 31, and the mask patterns 52 may be used as an etching mask to perform a patterning process. As a result, second phase change patterns PC2, second metal patterns MB2, and third electrodes EL3 may be sequentially formed on the first metal layer 31. One of the first phase change layer 43 and the second phase change pattern PC2 may be formed of the same material as that of one of the switching layer and the variable resistance layer that are discussed with reference to FIG. 14, and the other of the first phase change layer 43 and the second phase change pattern PC2 may be formed of the same material as that of the other of the switching layer and the variable resistance layer.

A first spacer layer SL1 and a second spacer layer SL2 may be sequentially formed to conformally cover sidewalls of the second phase change patterns PC2 and a top surface of the first metal layer 31. The formation of the first spacer layer SL1 may be performed without oxygen gas or oxygen plasma. For example, the formation of the first spacer SL1 may include performing one or more of an atomic layer deposition process, a chemical vapor deposition process, a physical vapor deposition process, and a rapid thermal process. For example, the first spacer layer SL1 may be formed at a temperature of about 200° C. to about 300° C. for about 30 minutes or less.

Because the formation of the first spacer layer SL1 is performed without oxygen gas or oxygen plasma, it may be possible to reduce damage caused when oxygen oxidizes exposed surfaces of the second phase change patterns PC2. When the exposed surfaces of the second phase change patterns PC2 are oxidized at a temperature or higher, oxide produced by oxidation may be easy to volatilize. When the exposed second phase change patterns PC2 are oxidized, a difference in the degree of oxidation may occur depending on constituent elements contained in the second phase change patterns PC2, and as a result, the second phase change patterns PC2 may unevenly or unintentionally change in composition or element proportion. For example, oxidation of the exposed second phase change patterns PC2 may increase proportions of germanium at surfaces the second phase change patterns PC.

According to embodiments, because the formation of the first spacer layer SL1 is performed without oxygen gas or oxygen plasma, it may be possible to prevent degradation of the second phase change patterns PC2.

The formation of the second spacer layer SL2 may be performed at a temperature relatively lower than that of the formation of the first spacer layer SL1. For example, the formation of the second spacer layer SL2 may be performed at a temperature equal to or less than about 50° C. The formation of the second spacer layer SL2 may include supplying oxygen gas or oxygen plasma. The low temperature for forming the second spacer layer SL2 may alleviate heat-induced regeneration of the second phase change patterns PC2. The second spacer layer SL2 may be formed by atomic layer deposition.

Referring to FIG. 25, a patterning process may be performed such that the first metal layer 31, the third conductive layer 23, the first phase change layer 43, and the second conductive layer 22 may be patterned to form first metal patterns MB1, second electrodes EL2, second phase change patterns PC2, and first electrodes EL1. During the patterning process, the first spacer layer SL1 may be changed into first spacers SP1, and the second spacer layer SL2 may be changed into second spacers SP2. As a result, first spacer structures SS1 may be formed that include the first spacers SP1 and the second spacers SP2. For example, the etching process may include one or more of ion beam etching and reactive ion etching.

Referring to FIG. 26, a capping layer CP may be formed. The capping layer CP may cover an exposed top surface of the second interlayer dielectric layer 112. The capping layer CP may include one or more of silicon nitride and silicon oxynitride. The capping layer CP may be formed by one or more of atomic layer deposition and chemical vapor deposition. For example, the capping layer CP may include one or more of SiN, SiON, SiCN, SiBN, and AlN. The capping layer CP may be in contact with sidewalls of the first and second electrodes EL1 and EL2 and sidewall of the first phase change patterns PC1.

Referring back to FIGS. 22 and 23, a buried dielectric layer 113 may be formed to fill gaps between the first cell structures CS1. After that, second conductive lines CL2 may be formed on the third electrodes EL3.

According to embodiments, a current leakage or bridging caused by conductive polymers may be prevented to increase electrical characteristics of a variable resistance memory device. According to embodiments, it may be possible to prevent degradation of switching elements and variable resistance patterns of a variable resistance memory device.

Although the embodiments have been discussed with reference to accompanying figures, it will be understood that various changes in form and details may be made therein without departing from the spirit and scope of the inventive concepts. It therefore will be understood that the embodiments described above are just illustrative but not limitative in all aspects.

What is claimed is:

1. A semiconductor device comprising:
   a plurality of first conductive lines disposed on a substrate;
   a plurality of second conductive lines intersecting the plurality of first conductive lines; and
   a plurality of cell structures interposed between the plurality of first conductive lines and the plurality of second conductive lines,
   wherein at least one among the plurality of cell structures comprises:
   a first electrode;
   a switching element disposed on the first electrode;
   a second electrode disposed on the switching element;
   a first metal pattern disposed on the second electrode;
   a variable resistance pattern interposed between the first metal pattern and at least one among the plurality of second conductive lines;
   a first spacer disposed on a sidewall of the variable resistance pattern, a sidewall of the first metal pattern and a sidewall of the second electrode, a bottom surface of the first spacer being interposed between a top surface of the second electrode and a bottom surface of the second electrode; and
   a second spacer disposed on the first spacer and a sidewall of the switching element.

2. The semiconductor device of claim 1, wherein the second spacer is further disposed on the sidewall of the second electrode and a top surface of the first electrode.

3. The semiconductor device of claim 1, wherein the at least one among the plurality of cell structures further comprises a conductive polymer layer disposed on the second spacer, a top surface of the first electrode, a sidewall of the first electrode, and a sidewall of at least one among the plurality of first conductive lines, and
   wherein the second spacer separates the second electrode and the switching element from the conductive polymer layer.

4. The semiconductor device of claim 3, wherein the at least one among the plurality of cell structures further comprises a third spacer disposed on the conductive polymer layer.

5. The semiconductor device of claim 4, wherein the at least one among the plurality of cell structures further comprises a capping layer disposed on the third spacer.

6. The semiconductor device of claim 3, wherein the sidewall of the switching element comprises a dent region that is recessed inwardly,
   wherein the second spacer conformally covers the dent region, and
   wherein the conductive polymer layer extends to the dent region.

7. The semiconductor device of claim 3, wherein the at least one among the plurality of cell structures further comprises a capping layer disposed on the conductive polymer layer.

8. The semiconductor device of claim 1, wherein the at least one among the plurality of cell structures further comprises a second metal pattern interposed between the variable resistance pattern and the at least one among the plurality of second conductive lines, and
   wherein the first spacer is further disposed on a sidewall of the second metal pattern.

9. The semiconductor device of claim 8, wherein the variable resistance pattern comprises a recess part that is formed by the sidewall of the variable resistance pattern being recessed inwardly from the sidewall of the first metal pattern and the sidewall of the second metal pattern,
   wherein the first spacer comprises:
   a first portion filling the recess part of the variable resistance pattern; and
   a second portion disposed on the sidewall of the second metal pattern, the sidewall of the first metal pattern and the sidewall of the second electrode, and
   wherein a first thickness of the first portion of the first spacer is greater than a second thickness of the second portion of the first spacer.

10. The semiconductor device of claim 1, wherein a first portion of the plurality of cell structures is disposed adjacent to a center of a cell array area of the substrate,
wherein a second portion of the plurality of cell structures is disposed on an edge of the cell array area, and
wherein the at least one among the plurality of cell structures is disposed on the edge of the cell array area.

11. A semiconductor device comprising:
a plurality of first conductive lines disposed on a substrate;
a plurality of second conductive lines intersecting the plurality of first conductive lines;
a plurality of first cell structures interposed between the plurality of first conductive lines and the plurality of second conductive lines, and disposed adjacent to a center of a cell array area of the substrate; and
a plurality of second cell structures interposed between the plurality of first conductive lines and the plurality of second conductive lines, and disposed on an edge of the cell array area,
wherein each of the plurality of first cell structures comprises:
a first electrode;
a switching element disposed on the first electrode;
a second electrode disposed on the switching element;
a first metal pattern disposed on the second electrode;
a variable resistance pattern interposed between the first metal pattern and at least one among the plurality of second conductive lines;
a first spacer disposed on a sidewall of the variable resistance pattern and a top surface of the first metal pattern; and
a second spacer disposed on the first spacer and a sidewall of the first metal pattern, and
wherein each of the plurality of first cell structures further comprises a capping layer disposed on the second spacer, a sidewall of the second electrode, a sidewall of the switching element, and a sidewall of the first electrode.

12. A semiconductor device comprising:
a plurality of first conductive lines disposed on a substrate;
a plurality of second conductive lines intersecting the plurality of first conductive lines;
a plurality of first cell structures interposed between the plurality of first conductive lines and the plurality of second conductive lines, and disposed adjacent to a center of a cell array area of the substrate; and
a plurality of second cell structures interposed between the plurality of first conductive lines and the plurality of second conductive lines, and disposed on an edge of the cell array area,
wherein each of the plurality of first cell structures comprises:
a first electrode;
a switching element disposed on the first electrode;
a second electrode disposed on the switching element;
a first metal pattern disposed on the second electrode;
a variable resistance pattern interposed between the first metal pattern and at least one among the plurality of second conductive lines;
a first spacer disposed on a sidewall of the variable resistance pattern and a top surface of the first metal pattern; and
a second spacer disposed on the first spacer and a sidewall of the first metal pattern, and
wherein the second spacer is further disposed on a top surface of the second electrode.

13. The semiconductor device of claim 11, wherein each of the plurality of first cell structures further comprises a third spacer disposed on the second spacer, a sidewall of the second electrode, a sidewall of the switching element, a sidewall of the first electrode, and a top surface of at least one among the plurality of first conductive lines.

14. The semiconductor device of claim 13, wherein each of the plurality of first cell structures further comprises a capping layer disposed on the third spacer and a sidewall of the at least one among the plurality of first conductive lines.

15. The semiconductor device of claim 11, wherein each of the plurality of first cell structures further comprises a second metal pattern interposed between the variable resistance pattern and the at least one among the plurality of second conductive lines,
wherein the variable resistance pattern comprises a recess part that is formed by the sidewall of the variable resistance pattern being recessed inwardly from the sidewall of the first metal pattern and a sidewall of the second metal pattern,
wherein the first spacer comprises:
a first portion filling the recess part of the variable resistance pattern; and
a second portion disposed on the sidewall of the second metal pattern, the sidewall of the first metal pattern and a sidewall of the second electrode, and
wherein a first thickness of the first portion of the first spacer is greater than a second thickness of the second portion of the first spacer.

16. The semiconductor device of claim 11, wherein each of the plurality of second cell structures comprises:
the first electrode;
the switching element disposed on the first electrode;
the second electrode disposed on the switching element;
the first metal pattern disposed on the second electrode;
the variable resistance pattern interposed between the first metal pattern and one or more among the plurality of second conductive lines;
the first spacer disposed on the sidewall of the variable resistance pattern, the sidewall of the first metal pattern and a sidewall of the second electrode, a bottom surface of the first spacer being interposed between a top surface of the second electrode and a bottom surface of the second electrode; and
the second spacer disposed on the first spacer and a sidewall of the switching element.

* * * * *